US012588551B2

(12) United States Patent
Cho et al.

(10) Patent No.: US 12,588,551 B2
(45) Date of Patent: Mar. 24, 2026

(54) SEMICONDUCTOR PACKAGE AND METHOD OF MANUFACTURING THE SEMICONDUCTOR PACKAGE

(71) Applicant: Samsung Electronics Co., Ltd., Suwon-si (KR)

(72) Inventors: Seunghyun Cho, Suwon-si (KR); Joonsik Sohn Lee, Yongin-si (KR); Chulhwan Choo, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 683 days.

(21) Appl. No.: 17/718,402

(22) Filed: Apr. 12, 2022

(65) Prior Publication Data

US 2023/0049855 A1 Feb. 16, 2023

(30) Foreign Application Priority Data

Aug. 12, 2021 (KR) ........................ 10-2021-0106801

(51) Int. Cl.
| | |
|---|---|
| *H01L 25/065* | (2023.01) |
| *H01L 23/00* | (2006.01) |
| *H01L 23/48* | (2006.01) |

(52) U.S. Cl.
CPC ........ *H01L 25/0657* (2013.01); *H01L 23/481* (2013.01); *H01L 24/06* (2013.01);
(Continued)

(58) Field of Classification Search
CPC ... H01L 25/0657; H01L 23/481; H01L 24/06; H01L 24/16; H01L 24/14;
(Continued)

(56) References Cited

U.S. PATENT DOCUMENTS

| | | | |
|---|---|---|---|
| 7,495,326 B2 | 2/2009 | Rinne | |
| 9,029,997 B2 * | 5/2015 | Lee | G11C 5/02 |
| | | | 257/773 |

(Continued)

FOREIGN PATENT DOCUMENTS

| | | |
|---|---|---|
| KR | 2010-0135091 A | 12/2010 |
| KR | 101620767 B1 | 5/2016 |

(Continued)

OTHER PUBLICATIONS

Extended European Search Report dated Jan. 23, 2023 for corresponding European Application No. 22166449.3.

(Continued)

*Primary Examiner* — Yasser A Abdelaziez
(74) *Attorney, Agent, or Firm* — Harness, Dickey & Pierce, P.L.C.

(57) ABSTRACT

A semiconductor package includes a semiconductor package includes first, second, third and fourth semiconductor chips sequentially stacked on one another. Each of the first, second, third and fourth semiconductor chips includes a first group of bonding pads and a second group of bonding pads alternately arranged in a first direction and input/output (I/O) circuitry selectively connected to the first group of bonding pads respectively. Each of the first, second and third semiconductor chips includes a first group of through electrodes electrically connected to the first group of bonding pads and a second group of through electrodes electrically connected to the second group of bonding pads.

20 Claims, 25 Drawing Sheets

(52) U.S. Cl.

CPC .............. *H01L 24/16* (2013.01); *H01L 24/14* (2013.01); *H01L 2224/0401* (2013.01); *H01L 2224/06181* (2013.01); *H01L 2224/14181* (2013.01); *H01L 2224/16146* (2013.01); *H01L 2224/16227* (2013.01); *H01L 2225/06513* (2013.01); *H01L 2225/06517* (2013.01); *H01L 2225/06541* (2013.01); *H01L 2225/06562* (2013.01)

(58) Field of Classification Search

CPC ... H01L 2224/0401; H01L 2224/06181; H01L 2224/14181; H01L 2224/16146; H01L 2224/16227; H01L 2225/06513; H01L 2225/06517; H01L 2225/06541; H01L 2225/06562; H01L 23/5252; H01L 23/5256; H01L 24/13; H01L 24/17; H01L 24/32; H01L 24/73; H01L 24/92; H01L 25/18; H01L 2224/0557; H01L 2224/131; H01L 2224/1403; H01L 2224/16145; H01L 2224/17181; H01L 2224/32145; H01L 2224/32225; H01L 2224/73204; H01L 2224/92125; H01L 2224/94; H01L 2225/06544; H01L 2225/06565; H01L 2225/06586; H01L 2924/15311; H01L 24/18; H01L 23/62; H01L 25/065; H01L 2224/24145; H01L 2224/2543; G11C 2207/105; G11C 2207/108; G11C 5/025; G11C 5/04; G11C 5/063

See application file for complete search history.

(56) References Cited

U.S. PATENT DOCUMENTS

| | | | | | |
|---|---|---|---|---|---|
| 9,474,145 | B2 | 10/2016 | Kim et al. | | |
| 9,905,535 | B2 | 2/2018 | Lee | | |
| 2008/0220565 | A1* | 9/2008 | Hsu | ......................... | H01L 25/50 438/109 |
| 2013/0294134 | A1* | 11/2013 | Lee | ..................... | H01L 25/0657 365/63 |
| 2014/0160867 | A1* | 6/2014 | Veches | ..................... | G11C 7/00 365/189.011 |
| 2015/0054169 | A1* | 2/2015 | Lee | ......................... | H01L 24/49 257/773 |
| 2015/0091189 | A1* | 4/2015 | Keeth | ................... | H01L 23/481 257/774 |
| 2020/0135262 | A1 | 4/2020 | Ware | | |
| 2021/0004340 | A1 | 1/2021 | Best | | |
| 2022/0005789 | A1* | 1/2022 | Koyanagi | .............. | H10B 43/30 |

FOREIGN PATENT DOCUMENTS

| | | |
|---|---|---|
| KR | 101709675 B1 | 2/2017 |
| KR | 1020200073643 A | 6/2020 |
| KR | 1020210031046 A | 3/2021 |

OTHER PUBLICATIONS

Office Action for Korean Application No. 10-2021-0106801 dated Jun. 26, 2025.

* cited by examiner

Figure 7:
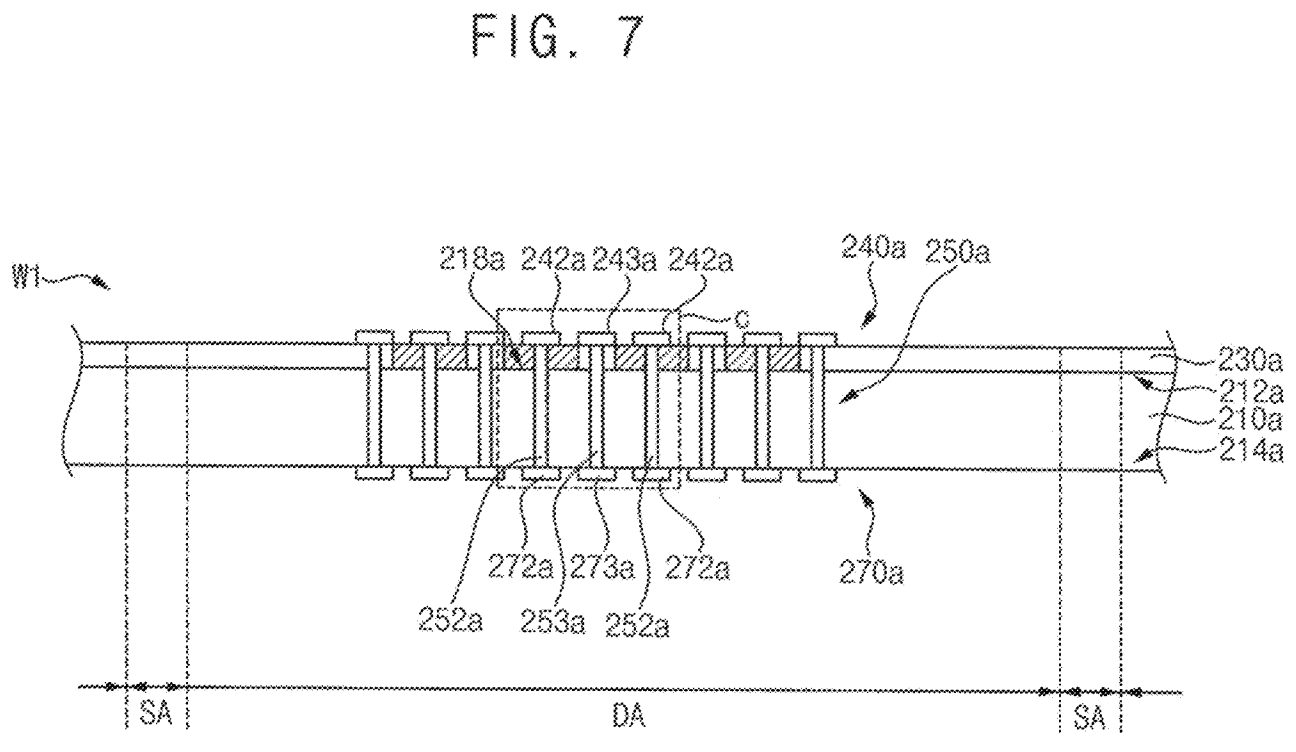

Figure 8:
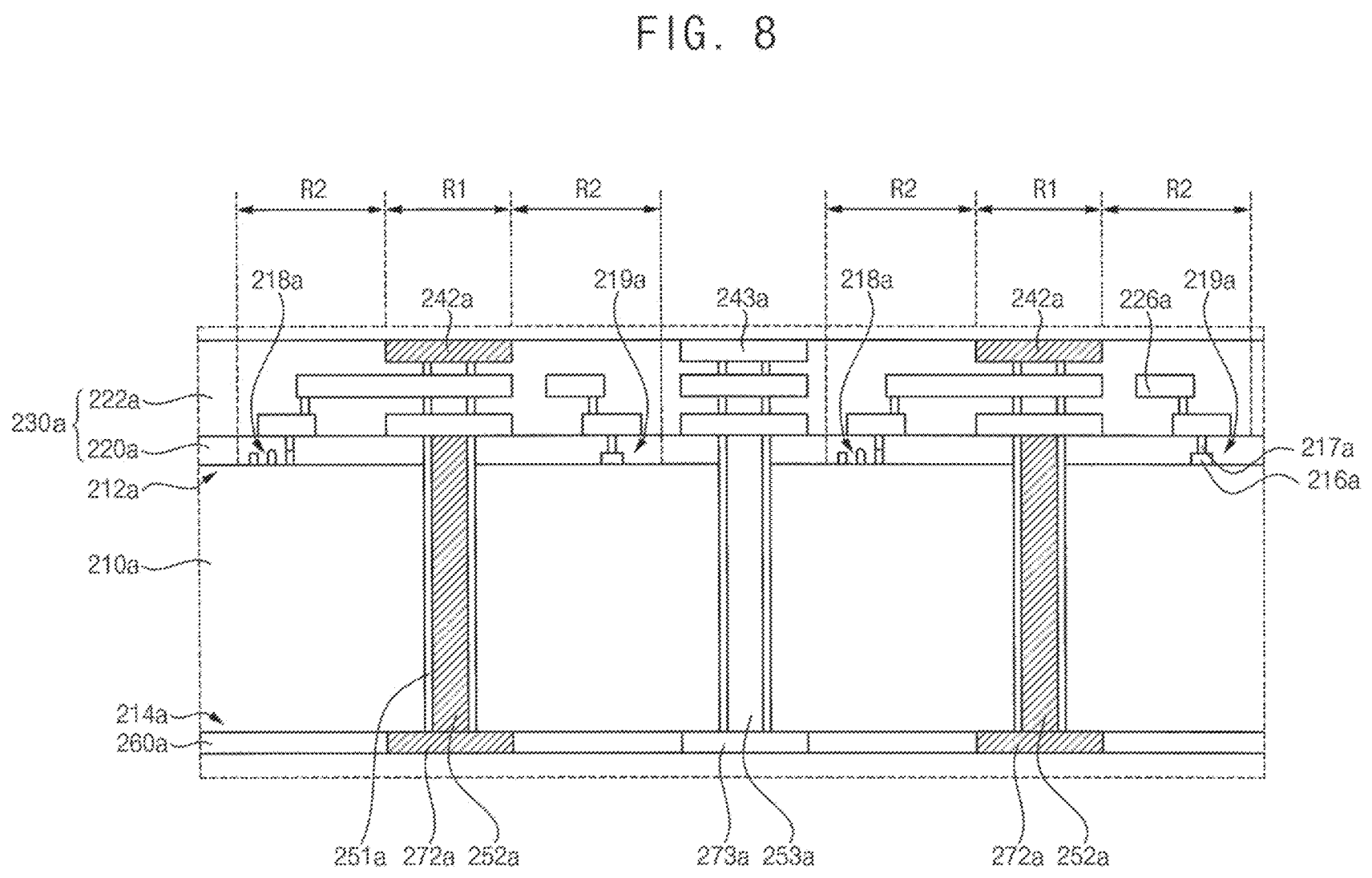

SEMICONDUCTOR PACKAGE AND METHOD OF MANUFACTURING THE SEMICONDUCTOR PACKAGE

PRIORITY STATEMENT

This application claims priority under 35 U.S.C. § 119 to Korean Patent Application No. 10-2021-0106801, filed on Aug. 12, 2021 in the Korean Intellectual Property Office (KIPO), the contents of which are herein incorporated by reference in their entirety.

BACKGROUND

1. Field

Some example embodiments relate to a semiconductor package and/or a method of manufacturing the semiconductor package. More particularly, some example embodiments relate to a semiconductor package including semiconductor chips stacked using through silicon vias and/or a method of manufacturing the same.

2. Description of the Related Art

A high bandwidth memory (HBM) device may include vertically stacked memory dies (chips). The memory dies may be electrically connected to each other by through electrodes such as through silicon vias (TSVs). When implementing a wideband memory package product, a chip on wafer process technology may be applied, and the number of data input/output (I/O) may be increasing to improve memory performance. However, the number of input/output through silicon vias may be an important factor to increase the number of I/O channels, but it may be difficult to reduce pitches of the through silicon vias due to a space occupied by an I/O driver circuit.

SUMMARY

Some example embodiments provide a semiconductor package having an improved input/output interface.

Some example embodiments provide a method of manufacturing the semiconductor package.

According to some example embodiments, a semiconductor package includes a semiconductor package including first, second, third and fourth semiconductor chips sequentially stacked on one another. Each of the first, second, third and fourth semiconductor chips includes a first group of bonding pads and a second group of bonding pads alternately arranged in a first direction and input/output (I/O) circuitry selectively connected to the first group of bonding pads respectively. Each of the first, second and third semiconductor chips includes a first group of through electrodes electrically connected to the first group of bonding pads and a second group of through electrodes electrically connected to the second group of bonding pads.

According to some example embodiments, a semiconductor package includes first, second, third and fourth semiconductor chips sequentially stacked on one another. Each of the first, second and third semiconductor chips includes a first group of through electrodes and a second group of through electrodes alternately arranged in a first direction and input/output (I/O) circuitry selectively connected to the first group of through electrodes respectively. The first group of through electrodes of the first and third semiconductor chips are electrically connected to the second group of through electrodes of the second and fourth semiconductor chips respectively, and the second group of through electrodes of the first and third semiconductor chips are electrically connected to the first group of through electrodes of the first and third semiconductor chips respectively.

According to some example embodiments, a semiconductor package includes first, second, third and fourth semiconductor chips sequentially stacked on one another and electrically connected to each other by conductive connection members. Each of the first, second, third and fourth semiconductor chips includes a first surface and a second surface opposite to each other, a first group of bonding pads and a second group of bonding pads on the first surface alternately arranged in a first direction, and input/output (I/O) circuitry selectively connected to the first group of bonding pads respectively. Each of the first, second and third semiconductor chips further includes a first group of through electrodes electrically connected to the first group of bonding pads and a second group of through electrodes electrically connected to the second group of bonding pads stacked on the package substrate. The first group of bonding pads of the first and third semiconductor chips are electrically connected to the second group of bonding pads of the second and fourth semiconductor chips respectively, and the second group of bonding pads of the first and third semiconductor chips are electrically connected to the first group of the second and fourth semiconductor chips respectively.

According to some example embodiments, a semiconductor package may include first, second, third and fourth semiconductor chips sequentially stacked on one another. Each of the first, second and third semiconductor chips may include a first group of through electrodes and a second group of through electrodes alternately arranged in a first direction. The first group of through electrodes may be selectively connected to I/O circuitry of each semiconductor chip respectively. The second group of through electrodes may not be connected to the I/O circuitry.

Since the second group of through electrodes is not connected to the I/O circuitry, an additional I/O circuit region may not be provided around a region in which the second group of through electrodes is formed. Accordingly, a pitch between data input/output (I/O) through electrodes may be reduced. Thus, the semiconductor package may provide an input/output (TSV I/O) structure having a larger number of through silicon vias to thereby implement a broadband interface.

BRIEF DESCRIPTION OF THE DRAWINGS

Some example embodiments will be more clearly understood from the following detailed description taken in conjunction with the accompanying drawings. FIGS. 1 to 25 represent non-limiting, example embodiments as described herein.

FIG. 1 is a cross-sectional view illustrating a semiconductor package in accordance with some example embodiments.

FIG. 2 is an enlarged cross-sectional view illustrating portion 'A' in FIG. 1.

FIG. 3 is a cross-sectional view taken along the line I-I' in FIG. 1.

FIG. 4 is a cross-sectional view illustrating transmission paths of data input/output (I/O) signals in the semiconductor package of FIG. 1.

FIG. 5 is a cross-sectional view illustrating transmission paths of data input/output (I/O) signals in a semiconductor package according to a comparative embodiment.

FIGS. 6 to 17 are views illustrating a method of manufacturing a semiconductor package in accordance with some example embodiments.

FIG. 18 is a cross-sectional view illustrating a semiconductor package in accordance with some example embodiments.

FIG. 19 is a cross-sectional view illustrating transmission paths of data input/output (I/O) signals in the semiconductor package of FIG. 18.

FIGS. 20 to 25 are views illustrating a method of manufacturing a semiconductor package in accordance with some example embodiments.

DETAILED DESCRIPTION

Hereinafter, some example embodiments will be explained in detail with reference to the accompanying drawings.

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

Figure 1:
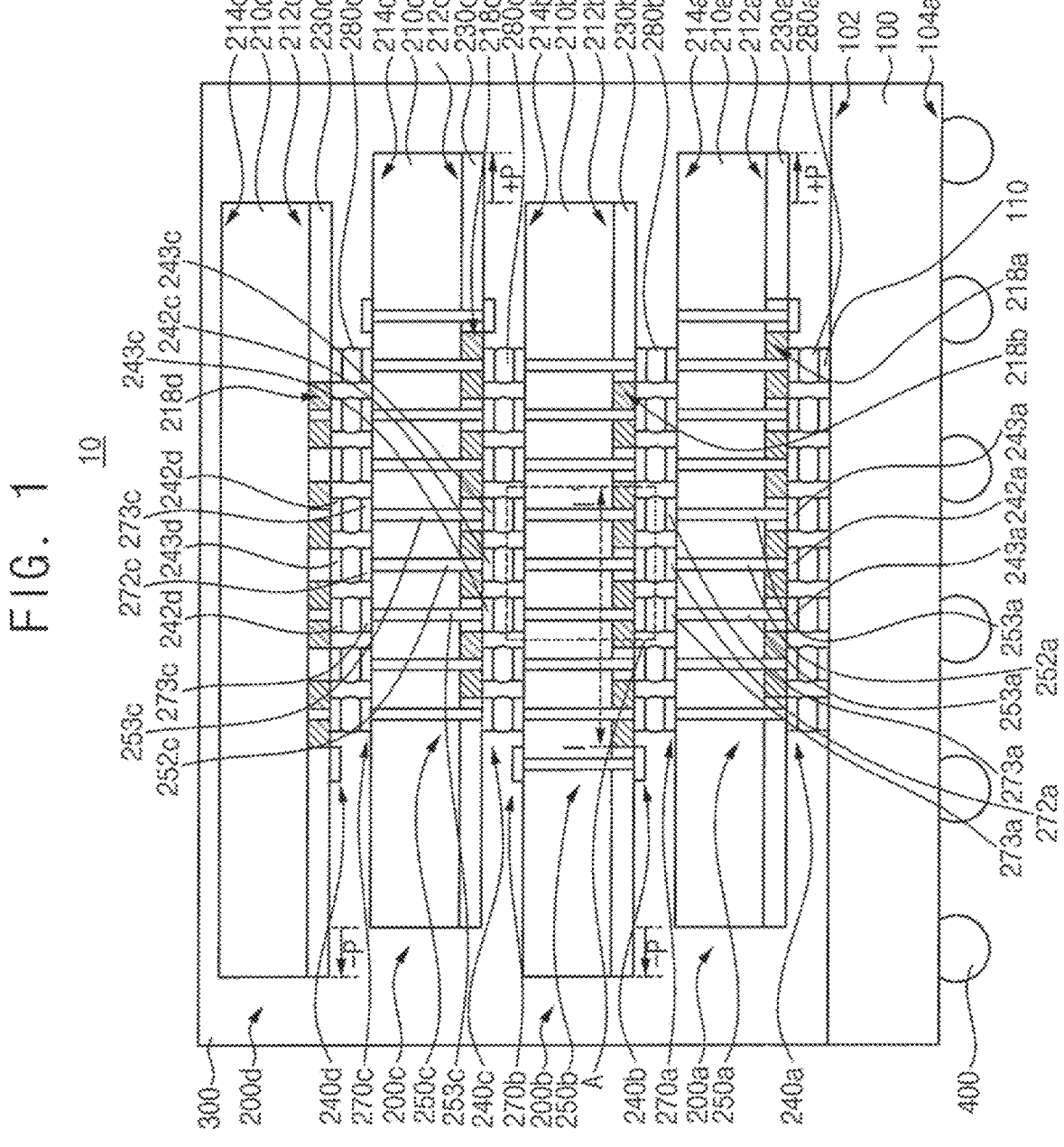
Figure 2:
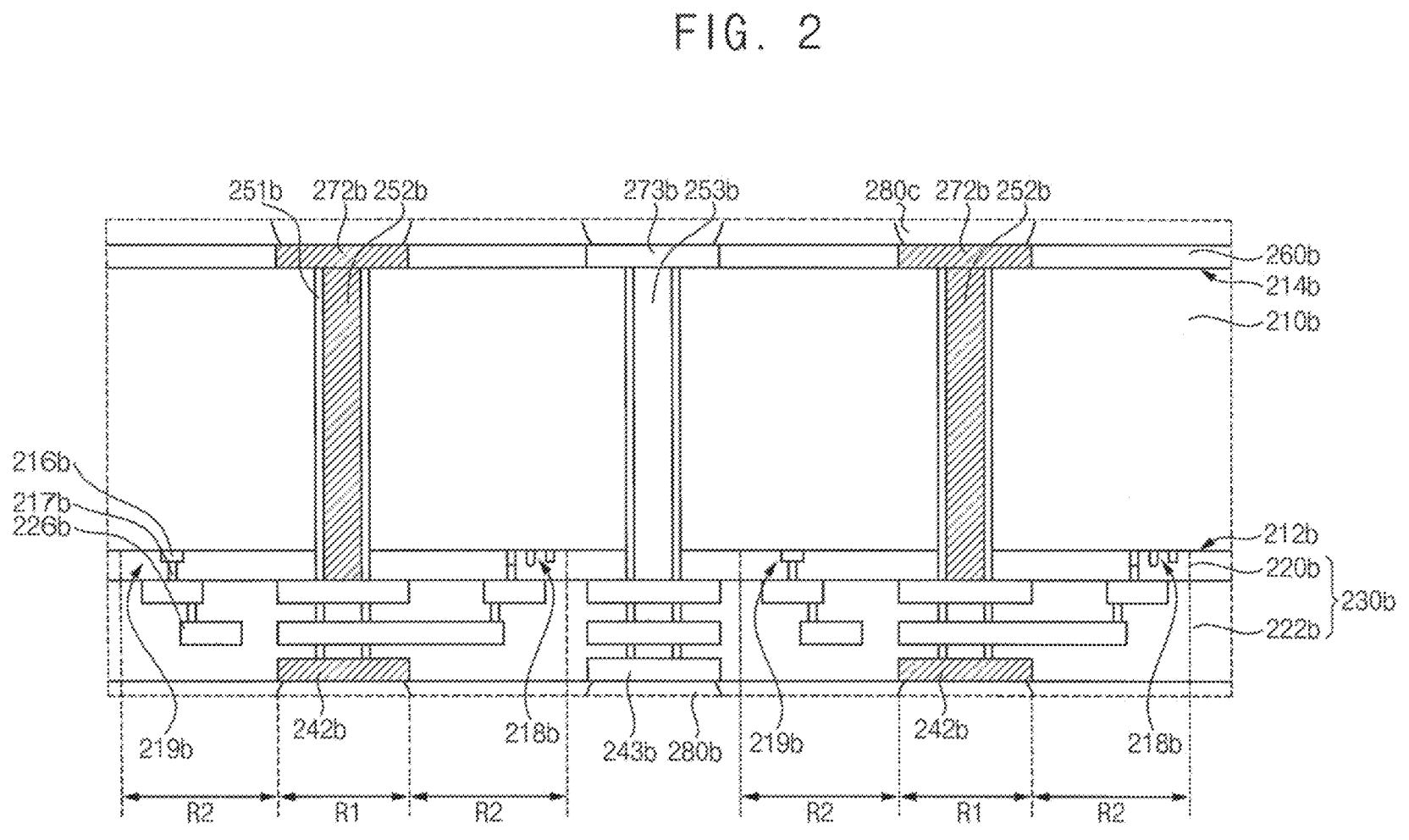
Figure 3:
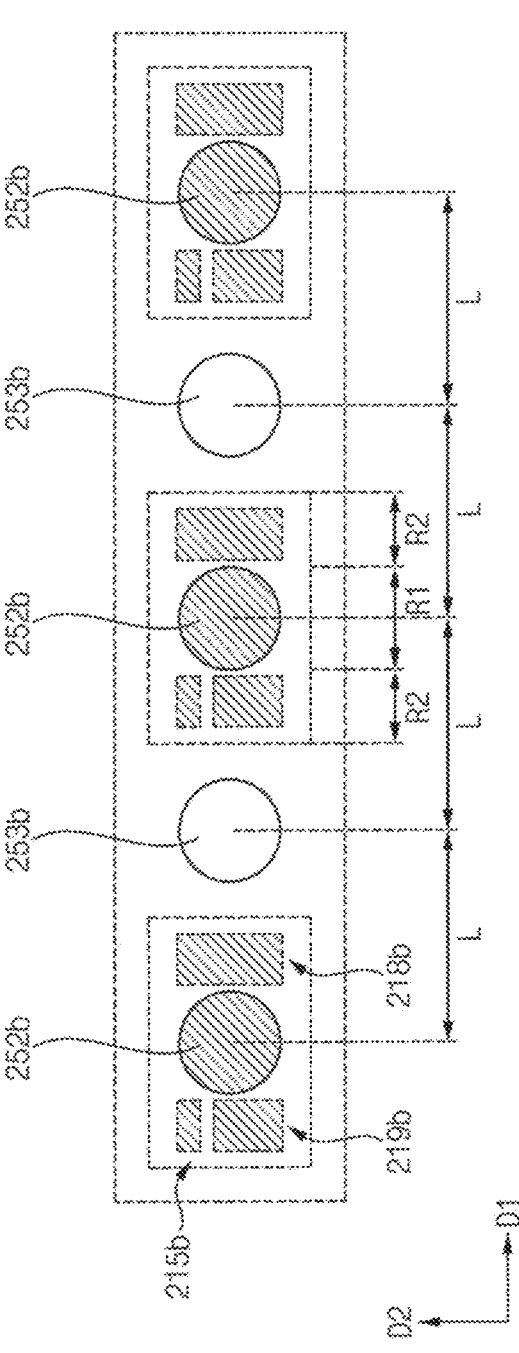

FIG. 1 is a cross-sectional view illustrating a semiconductor package in accordance with some example embodiments. FIG. 2 is an enlarged cross-sectional view illustrating portion 'A' in FIG. 1. FIG. 3 is a cross-sectional view taken along the line I-I' in FIG. 1.

Referring to FIGS. 1 to 3, a semiconductor package 10 may include stacked semiconductor chips. The semiconductor package 10 may include a base chip 100, first to fourth semiconductor chips 200a, 200b, 200c and/or 200d sequentially stacked on the base chip 100, and/or a molding member 300 on the base chip 100 covering the first to fourth semiconductor chips 200a, 200b, 200c and/or 200d. Additionally, the semiconductor package 10 may further include first to fourth conductive connection members 280a, 280b, 280c and/or 280d for electrical connection between the base chip 100 and the first to fourth semiconductor chips 200a, 200b, 200c and/or 200d.

In this embodiment, the first to fourth semiconductor chips 200a, 200b, 200c, and/or 200d may be substantially the same as or similar to each other. Thus, same or like reference numerals will be used to refer to the same or like elements and any further repetitive explanation concerning the above elements will be omitted.

The base chip 100 and the first to fourth semiconductor chips 200a, 200b, 200c and/or 200d may be stacked on a package substrate such as printed circuit board (PCB), an interposer, etc. In this embodiment, the semiconductor package as multi-chip package including five stacked semiconductor dies (chips) 100, 200a, 200b, 200c and 200d are exemplarily illustrated, and thus, it may not be limited thereto.

For some example, the semiconductor package 10 may include a high bandwidth memory (HBM) device. The high bandwidth memory (HBM) package may have a wideband interface for faster data exchange than a processor chip. The HBM package may have an input/output (TSV I/O) structure having a large number of through silicon vias (TSVs) to implement the wideband interface. The processor chip that requires support for the HBM package may be central processing unit (CPU), graphics processing unit (GPU), microprocessor, microcontroller, or application processor (AP), an application specific integrated circuit (ASIC) chip including a digital signal processing core and an interface for signal exchange, etc.

The semiconductor package 10 may include the base chip 100 as a buffer die and the first to fourth semiconductor chips 200a, 200b, 200c and/or 200d as memory dies, which are sequentially stacked on one another. The first to fourth semiconductor chips 200a, 200b, 200c and/or 200d may be electrically connected to each other by through electrodes such as through silicon vias (TSVs). The memory die may include a memory device, and the buffer die may include a controller for controlling the memory device.

The base chip 100 may have an upper surface 102 and a lower surface 104 opposite to each other. Substrate pads 110 for electrical connection with the first semiconductor chip 200a may be provided on the upper surface 102 of the base chip 100. Outer connection pads 400 for electrical connection with an external device may be provided on the lower surface 104 of the base substrate 100.

The first semiconductor chip 200a may include a first substrate 210a, a first front insulation layer 230a, a plurality of first bonding pads 240a, a plurality of first through electrodes 250a and/or a plurality of second bonding pads 270a. Additionally, the first semiconductor chip 200a may further include first conductive connection members 280a provided on the first bonding pads 240a respectively. The first semiconductor chip 200a may be mounted on the base chip 100 via the first conductive connection members 280a. For example, the first conductive connection members 280a may include conductive bumps such as solder bumps.

The first substrate 210a may have a first surface 212a and a second surface 214a opposite to each other. The first surface may be an active surface, and the second surface may be a non-active surface. Circuit patterns and/or cells may be formed in the first surface 212a of the first substrate 210a. For example, the first substrate 210a may be a single crystalline silicon substrate. The circuit patterns may include a transistor, a capacitor, a diode, etc. The circuit patterns may constitute circuit elements. Accordingly, the first semiconductor chip 200a may be a semiconductor device including a plurality of the circuit elements formed therein.

The first front insulation layer 230a may be provided as an insulation interlayer on the first surface 212a, e.g., the active surface of the first substrate 210a. The first front insulation layer 230a may include a plurality of insulation layers and wirings in the insulation layers. The first bonding pads 240a may be provided in the outermost insulation layer of the first front insulation layer 230a.

The first through electrodes (through silicon via, TSV) 250a may be provided to penetrate through the first substrate 210a from the first surface 212a to the second surface 214a of the first substrate 210a. A first end portion of the first through electrodes 250a may contact the wiring of the first front insulation layer. However, it may not be limited thereto, and for example, the first through electrodes 250a may be provided to penetrate through the first front insulation layer and directly contact the first bonding pad 240a.

A first backside insulation layer 260a (shown in FIG. 8) may be provided on the second surface 214a, e.g., the backside surface of the first substrate 210a. The second bonding pads 270a may be provided in the first backside insulation layer 260a. The second bonding pad 270a may be arranged on an exposed surface of the first through electrodes 250a. Accordingly, the first and second bonding pads 240a and 270a may be electrically connected to each other by the first through electrodes 250a.

The first and second bonding pads 240a and 270a may be arranged in respective pad arrays on an upper surface and a lower surface of the first semiconductor chip, and the first through electrodes 250a may be provided in the first surface 210a to be arranged in an array. The via array of the first through electrodes 250a may be designed to correspond to the pad arrays of the first and second bonding pads 240a and 270a.

The first through electrodes 250a may include a first group of through electrodes 252a and/or a second group of through electrodes 253a alternately arranged in a first direction. The first group of through electrodes 252a may be arranged to be spaced apart from each other in the first direction. The second group of through electrodes 253a may be arranged to be spaced apart from each other in the first direction. Each, or one or more, of the second group of through electrodes 253a may be arranged between the first group of through electrodes 252a adjacent to each other. The first through electrodes 250a may be arranged to be spaced apart from each other by the same distance in the first direction.

The first bonding pads 240a may include a first group of bonding pads 242a electrically connected to the first group of through electrodes 252a respectively and/or a second group of bonding pads 243a electrically connected to the second group of through electrodes 253a respectively. The first group of bonding pads 242a and the second group of bonding pads 243a may be alternately arranged in the first direction.

The second bonding pads 270a may include a first group of bonding pads 272a electrically connected to the first group of through electrodes 252a respectively and/or a second group of bonding pads 273a electrically connected to the second group of through electrodes 253a respectively. The first group of bonding pads 272a and the second group of bonding pads 273a may be alternately arranged in the first direction.

Each, or one or more, of the first group of through electrodes 252a and/or the second group of through electrodes 253a may be used as a portion of an input/output (I/O) path through which data signals are transmitted. The first and/or second bonding pads 240a and 270a electrically connected to each other by the first group of through electrodes 252a and/or the second group of through electrodes 253a, respectively, may be used as data input/output (I/O) pads.

The first group of through electrodes 252a and/or the first group of bonding pads 242a and/or 272a may be selectively connected to an I/O circuitry 218a. The second group of through electrodes 253a and/or the second group of bonding pads 243a and/or 273a may not be connected to the I/O circuitry. The first semiconductor chip 200a may further include a fuse portion 215a (shown in FIG. 9) capable of electrically decoupling the I/O circuitry 218a from the first group of through electrodes 252a and the first group of bonding pads 242a and 272a. For example, the fuse portion may include a programmable fuse or an anti-fuse. Accordingly, the I/O circuitry 218a may be selectively connected to or disconnected from the first group of through electrodes 252a and/or the first group of connection pads 242a and/or 272a by the fuse portion.

The second semiconductor chip 200b may include a second substrate 210b, a second front insulation layer 230b, a plurality of third bonding pads 240b, a plurality of second through electrodes 250b and/or a plurality of fourth bonding pads 270b. Additionally, the second semiconductor chip 200b may further include second conductive connection members 280b provided on the third bonding pads 240b respectively. The second semiconductor chip 200b may be mounted on the first semiconductor chip 200b via the second conductive connection members 280b. For example, the second conductive connection members 280b may include conductive bumps such as solder bumps.

As illustrated in FIGS. 2 and 3, the second through electrodes 250b may include a first group of through electrodes 252b and/or a second group of through electrodes 253b alternately arranged in a first direction D1. The first group of through electrodes 252b may be arranged to be spaced apart from each other in the first direction D1. The second group of through electrodes 253b may be arranged to be spaced apart from each other in the first direction D1. Each, or one or more, of the second group of through electrodes 253b may be arranged between the first group of through electrodes 252b adjacent to each other.

For example, a distance (between midpoints) 2 L between the adjacent first through electrodes 252ba of the first group may be equal to a distance 2 L between the adjacent through electrodes 253b of the second group. A distance L between the through electrode 252b of the first group and the through electrode 253b of the second group adjacent to each other may be half of the distance 2 L between the adjacent through electrodes 252b of the first group.

The third bonding pads 240b may include a first group of bonding pads 242b electrically connected to the first group of through electrodes 252b respectively and/or a second group of bonding pads 243b electrically connected to the second group of through electrodes 253b respectively. The first group of bonding pads 242b and the second group of bonding pads 243b may be alternately arranged in the first direction D1.

The fourth bonding pads 270b may include a first group of bonding pads 272b electrically connected to the first group of through electrodes 252b respectively and/or a second group of bonding pads 273b electrically connected to the second group of through electrodes 253b respectively. The first group of bonding pads 272b and the second group of bonding pads 273b may be alternately arranged in the first direction D1.

In some example embodiments, circuit patterns 216b may include an input/output (I/O) circuitry 218b for transmitting data signals and/or an electrostatic discharge circuitry 219*b* associated with the I/O circuitry 218*b*. Each, or one or more, of the first group of through electrodes 252*b* and/or the second group of through electrodes 253*b* may be used as a portion of an input/output (I/O) path through which the data signals are transmitted. The third and fourth bonding pads 240*b* and 270*b* may be electrically connected to each other by the first group of through electrodes 252*b* and the second group of through electrodes 253*b*, respectively, may be used as input/output (I/O) pads.

Although it is not illustrated in the figures, the second semiconductor chip may further include control signal through electrodes for transmitting control signals such as address and command, and/or control signal pads electrically connected to the control signal through electrodes.

In some example embodiments, the first group of through electrodes 252*b* and/or the first group of bonding pads 242*b* and 272*b* may be selectively connected to the I/O circuitry 218*b*. The second group of through electrodes 253*b* and/or the second group of bonding pads 243*b* and/or 273*b* may not be connected to the I/O circuitry. The circuit pattern 216*b* may further include a fuse portion 215*b* capable of electrically decoupling the I/O circuitry 218*b* from the first group of through electrodes 252*b* and/or the first group of bonding pads 242*b* and/or 272*b*. For example, the fuse portion may include a programmable fuse and/or an anti-fuse. Accordingly, the I/O circuitry 218*b* may be selectively connected to or disconnected from the first group of through electrodes 252*b* and/or the first group of connection pads 242*b* and/or 272*b* by the fuse portion.

As illustrated in FIG. 3, a second region R2 in which the I/O circuitry 218*b* and/or the electrostatic discharge circuitry 219*b* are formed may be provided around a first region R1 in which the first group of through electrodes 252*b* are formed. The first region R1 may be a TSV region, and the second region R2 may be an I/O circuit region. Since the second group of through electrodes 253*b* is not connected to the I/O circuitry, an additional I/O circuit region may not be provided around the region in which the second group of through electrodes 253*b* is formed.

Accordingly, after arranging the first group of through electrodes 252*b*, the second group of through electrodes 253*b* may be arranged between the first group of through electrodes 252*b* while maintaining the original array of the first group of through electrodes 252*b*. Thus, an input/output (TSV I/O) structure having a large number of through silicon vias may be provided, to thereby implement a broadband interface.

The second semiconductor chip 200*b* may be identical to the first semiconductor chip 200*a* in terms of structural form. For example, an arrangement of through electrodes and an arrangement of bonding pads of the second semiconductor chip 200*b* may be the same as the arrangement of the through electrodes and the arrangement of the bonding pads of the first semiconductor chip 200*a*.

The second semiconductor chip 200*b* may be stacked on the first semiconductor chip 200*a* through the second conductive connection members 280*b*. The second semiconductor chip 200*b* may be arranged on the first semiconductor chip 200*a* such that the third bonding pad 240*b* of the second semiconductor chip 200*b* faces the second bonding pad 270*a* of the first semiconductor chip 200*a*.

In some example embodiments, the second semiconductor chip 200*b* may be offset from the first semiconductor chip 200*a* by a preset (or alternately given) interval (−P) in the first direction such that the first group of through electrodes 252*b* of the second semiconductor chip 200*b* are electrically connected to the second group of through electrodes 253*a* of the first semiconductor chip 200*a*, respectively, and the second group of through electrodes 253*b* of the second semiconductor chip 200*b* are electrically connected to the first group of through electrodes 252*a* of the first semiconductor chip 200*a*, respectively. The preset (or alternately given) interval may be a distance between adjacent through electrodes, for example, a pitch.

The first group of bonding pads 242*b* of the third bonding pads 240*b* of the second semiconductor chip 200*b* may be electrically connected to the second group of bonding pads 273*a* of the second bonding pads 270*a* of the first semiconductor chip 200*a*, respectively, and the second group of bonding pads 243*b* of the third bonding pads 240*b* of the second semiconductor chip 200*b* may be electrically connected to the first group of bonding pads 272*a* of the second bonding pads 270*a* of the first semiconductor chip 200*a*, respectively.

The third semiconductor chip 200*c* may include a third substrate 210*c*, a third front insulation layer 230*c*, a plurality of fifth bonding pads 240*c*, a plurality of third through electrodes 250*c* and/or a plurality of sixth bonding pads 270*c*. Additionally, the third semiconductor chip 200*c* may further include third conductive connection members 280*c* provided on the fifth bonding pads 240*c* respectively. The third semiconductor chip 200*c* may be mounted on the second semiconductor chip 200*b* via the third conductive connection members 280*c*. For example, the third conductive connection members 280*c* may include conductive bumps such as solder bumps.

The third through electrodes 250*c* may include a first group of through electrodes 252*c* and/or a second group of through electrodes 253*c* alternately arranged in a first direction. The first group of through electrodes 252*c* may be arranged to be spaced apart from each other in the first direction. The second group of through electrodes 253*c* may be arranged to be spaced apart from each other in the first direction. Each, or one or more, of the second group of through electrodes 253*c* may be arranged between the first group of through electrodes 252*c* adjacent to each other.

The fifth bonding pads 240*c* may include a first group of bonding pads 242*c* electrically connected to the first group of through electrodes 252*c* respectively and/or a second group of bonding pads 243*c* electrically connected to the second group of through electrodes 253*c* respectively. The first group of bonding pads 242*c* and the second group of bonding pads 243*c* may be alternately arranged in the first direction.

The sixth bonding pads 270*c* may include a first group of bonding pads 272*c* electrically connected to the first group of through electrodes 252*c* respectively and/or a second group of bonding pads 273*c* electrically connected to the second group of through electrodes 253*c* respectively. The first group of bonding pads 272*c* and the second group of bonding pads 273*c* may be alternately arranged in the first direction.

Each, or one or more, of the first group of through electrodes 252*c* and/or the second group of through electrodes 253*c* may be used as a portion of an input/output (I/O) path through which data signals are transmitted. The first and second bonding pads 240*c* and 270*c* electrically connected to each other by the first group of through electrodes 252*c* and the second group of through electrodes 253*c*, respectively, may be used as input/output (I/O) pads.

The first group of through electrodes 252*c* and/or the first group of bonding pads 242*c* and 272*c* may be selectively connected to an I/O circuitry 218*c*. The second group of through electrodes 253c and/or the second group of bonding pads 243c and 273c may not be connected to the I/O circuitry. The third semiconductor chip 200c may further include a fuse portion capable of electrically decoupling the I/O circuitry from the first group of through electrodes 252c and the first group of bonding pads 242c and 272c. For example, the fuse portion may include a programmable fuse or an anti-fuse. Accordingly, the I/O circuitry 218c may be selectively connected to or disconnected from the first group of through electrodes 252c and the first group of connection pads 242c and 272c by the fuse portion.

The third semiconductor chip 200c may be identical to the second semiconductor chip 200b in terms of structural form. For example, an arrangement of through electrodes and an arrangement of bonding pads of the third semiconductor chip 200c may be the same as the arrangement of the through electrodes and the arrangement of the bonding pads of the second semiconductor chip 200b.

The third semiconductor chip 200c may be stacked on the second semiconductor chip 200b through the third conductive connection members 280c. The third semiconductor chip 200c may be arranged on the second semiconductor chip 200b such that the fifth bonding pad 240c of the third semiconductor chip 200c faces the fourth bonding pad 270b of the second semiconductor chip 200b.

In some example embodiments, the third semiconductor chip 200c may be offset from the second semiconductor chip 200b by a preset (or alternately given) interval (+P) in a reverse direction of the first direction such that the first group of through electrodes 252c of the third semiconductor chip 200c are electrically connected to the second group of through electrodes 253b of the second semiconductor chip 200b, respectively, and the second group of through electrodes 253c of the third semiconductor chip 200c are electrically connected to the first group of through electrodes 252b of the second semiconductor chip 200b, respectively. The preset (or alternately given) interval may be a distance between adjacent through electrodes, for example, a pitch.

The first group of bonding pads 242c of the fifth bonding pads 240c of the third semiconductor chip 200c may be electrically connected to the second group of bonding pads 273b of the fourth bonding pads 270b of the second semiconductor chip 200b, respectively, and the second group of bonding pads 243c of the fifth bonding pads 240c of the third semiconductor chip 200c may be electrically connected to the first group of bonding pads 272b of the fourth bonding pads 270b of the second semiconductor chip 200b, respectively.

The fourth semiconductor chip 200d may include a fourth substrate 210d, a fourth front insulation layer 230d and/or a plurality of seventh bonding pads 240d. Additionally, the fourth semiconductor chip 200d may further include fourth conductive connection members 280d provided on the seventh bonding pads 240d respectively. The fourth semiconductor chip 200d may be mounted on the third semiconductor chip 200c via the fourth conductive connection members 280d. For example, the fourth conductive connection members 280d may include conductive bumps such as solder bumps.

The seventh bonding pads 240d may include a first group of bonding pads 242d and/or a second group of bonding pads 243d. The first group of bonding pads 242d and the second group of bonding pads 243d may be alternately arranged in the first direction. The seventh bonding pads 240d may be used as data input/output (I/O) pads. The first group of bonding pads 242d may be selectively connected to an I/O circuitry 218d. The second group of bonding pads 243d may not be connected to the I/O circuitry.

The fourth semiconductor chip 200d may further include a fuse portion capable of electrically decoupling the I/O circuitry 218d from the first group of bonding pads 242d. For example, the fuse portion may include a programmable fuse or an anti-fuse. Accordingly, the I/O circuitry 218d may be selectively connected to or disconnected from the first group of connection pads 242d by the fuse portion.

The fourth semiconductor chip 200d may be identical to the third semiconductor chip 200c in terms of structural form. For example, an arrangement of the data input/output bonding pads of the fourth semiconductor chip 200d may be the same as the arrangement of the data input/output bonding pads of the third semiconductor chip 200c.

The fourth semiconductor chip 200d may be stacked on the third semiconductor chip 200c through the fourth conductive connection members 280d. The fourth semiconductor chip 200d may be arranged on the third semiconductor chip 200c such that the seventh bonding pad 240d of the fourth semiconductor chip 200d faces the sixth bonding pad 270c of the third semiconductor chip 200c.

In some example embodiments, the fourth semiconductor chip 200d may be offset from the third semiconductor chip 200c by a preset (or alternately given) interval (–P) in the first direction such that the first group of bonding pads 242d of the seventh bonding pads 240d of the fourth semiconductor chip 200d are electrically connected to the second group of bonding pads 273c of the sixth bonding pads 270c of the third semiconductor chip 200c, respectively, and the second group of bonding pads 243d of the seventh bonding pads 240d of the fourth semiconductor chip 200d are electrically connected to the first group of bonding pads 272c of the sixth bonding pads 270c of the third semiconductor chip 200c, respectively. The preset (or alternately given) interval may be a distance between adjacent through electrodes, for example, a pitch.

For example, each, or one or more, of the first, second and/or third through electrodes 250a, 250b, and 250c may have a first diameter. The first diameter may be within a range of 3 μm to 20 μm. Each, or one or more, of the first to seventh bonding pads may have a second diameter greater than the first diameter. The second diameter may be within a range of 10 μm to 25 μm.

In some example embodiments, the molding member 300 may be provided on the base chip 100 to cover the first, second, third and/or fourth semiconductor chips 200a, 200b, 200c and 200d. The molding member 300 may cover side surfaces of the first, second, third and/or fourth semiconductor chips 200a, 200b, 200c and 200d. The molding member 300 may cover or expose an upper surface of the fourth semiconductor chip 200d. For example, the molding member 300 may include a thermosetting resin such as epoxy molding compound (EMC) material.

In addition, the semiconductor package 10 may further include external connection members 400 respectively disposed on the outer connection pads for electrical connection with an external device provided on the lower surface 104 of the base chip 100. The external connection members may include solder bumps, solder balls, etc.

Figure 4:
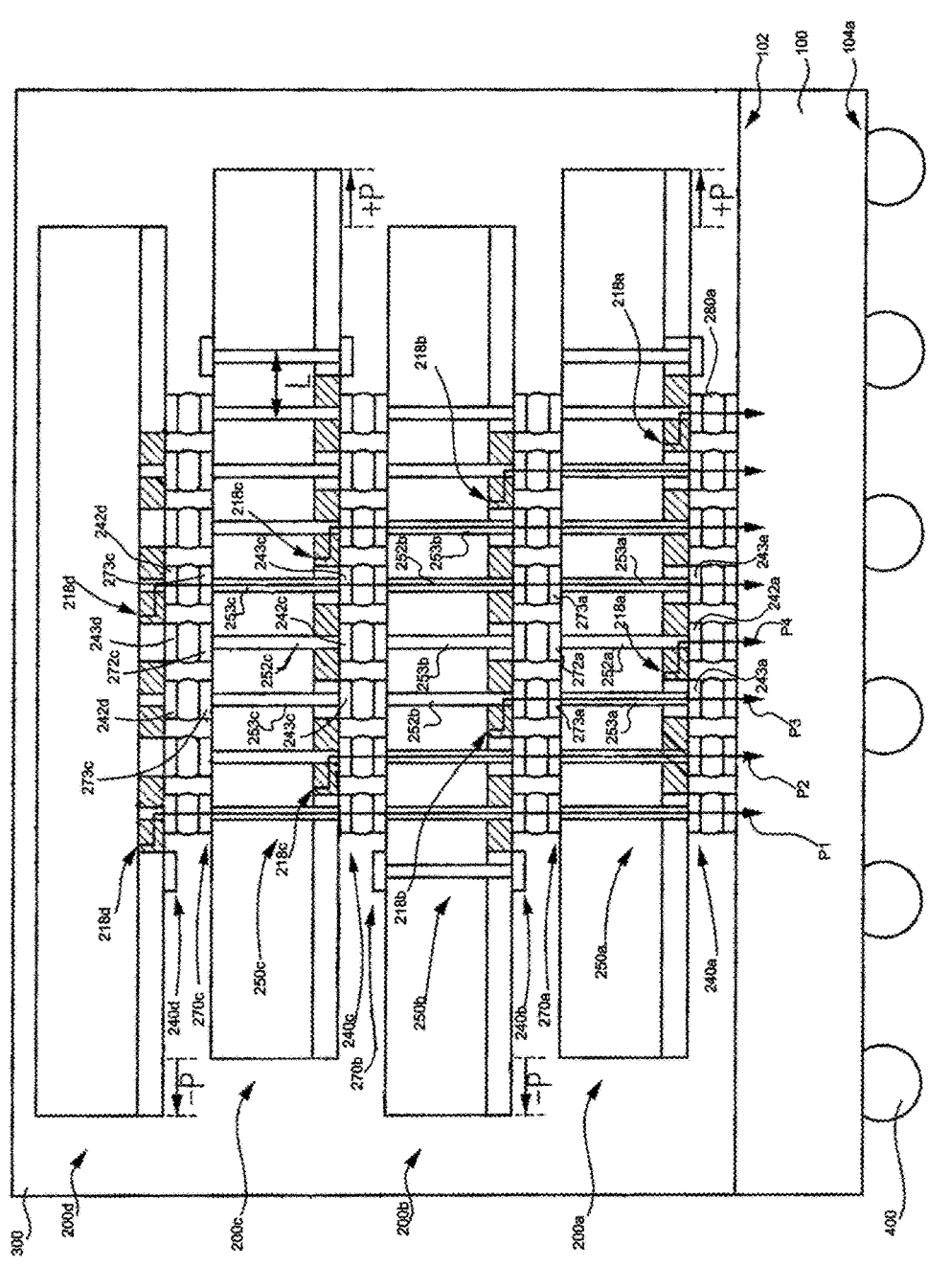

FIG. 4 is a cross-sectional view illustrating transmission paths of data input/output (I/O) signals in the semiconductor package of FIG. 1.

Referring to FIG. 4, the base chip 100 may access any of the second, third and/or fourth semiconductor chips 200b, 200c and 200d of the stack package 10 by way of at least some of the first to third through electrodes 250a, 250b and 250c, and/or data input/output signals from the second, third and/or fourth semiconductor chips 200b, 200c and 200d may be transmitted to the base chip 100 by way of at least some of the first to third through electrodes 250a, 250b and 250c.

In particular, a signal from the I/O circuitry 218d of the fourth semiconductor chip 200d may be transmitted to the base chip 100 through the second group of through electrodes 253c of the third semiconductor chip 200c, the first group of through electrodes 252b of the second semiconductor chip 200b and the second group of through electrodes 253a of the first semiconductor chip 200a. The second group of through electrodes 253c of the third semiconductor chip 200c, the first group of through electrodes 252b of the second semiconductor chip 200b and the second group of through electrodes 253a of the first semiconductor chip 200a may serve as an I/O signal path P1 which connects between the I/O circuitry 218d of the fourth semiconductor chip 200d and the base chip 100.

A signal from the I/O circuitry 218c of the third semiconductor chip 200c may be transmitted to the base chip 100 through the second group of through electrodes 253b of the second semiconductor chip 200b and the first group of through electrodes 252a of the first semiconductor chip 200a. The second group of through electrodes 253b of the second semiconductor chip 200b and the first group of through electrodes 252a of the first semiconductor chip 200a may serve as an I/O signal path P2 which connects between the I/O circuitry 218c of the third semiconductor chip 200c and the base chip 100.

A signal from the I/O circuitry 218b of the second semiconductor chip 200b may be transmitted to the base chip 100 through the second group of through electrodes 253a of the first semiconductor chip 200a. The second group of through electrodes 253a of the first semiconductor chip 200a may serve as an I/O signal path P3 which connects between the I/O circuitry 218b of the second semiconductor chip 200b and the base chip 100.

Only one of every four bonding pads consecutively arranged in a given row may be operated to be connected to the I/O circuitry, defining a staggered I/O circuit pattern. This may allow for point-to-point connections between the base chip 100 and the first to fourth semiconductor chips 200a, 200b, 200c and 200d.

Figure 5:
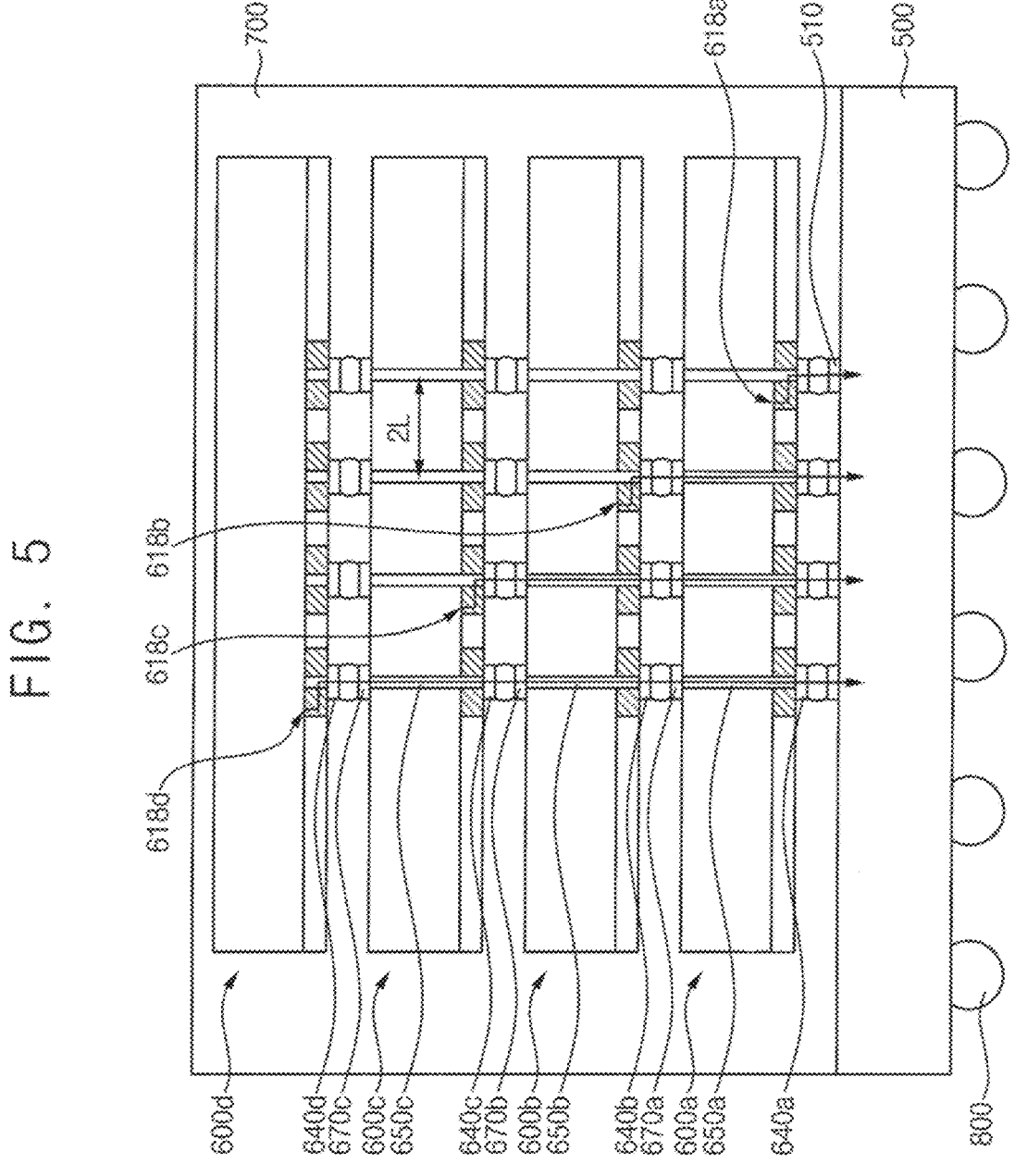
Figure 6:
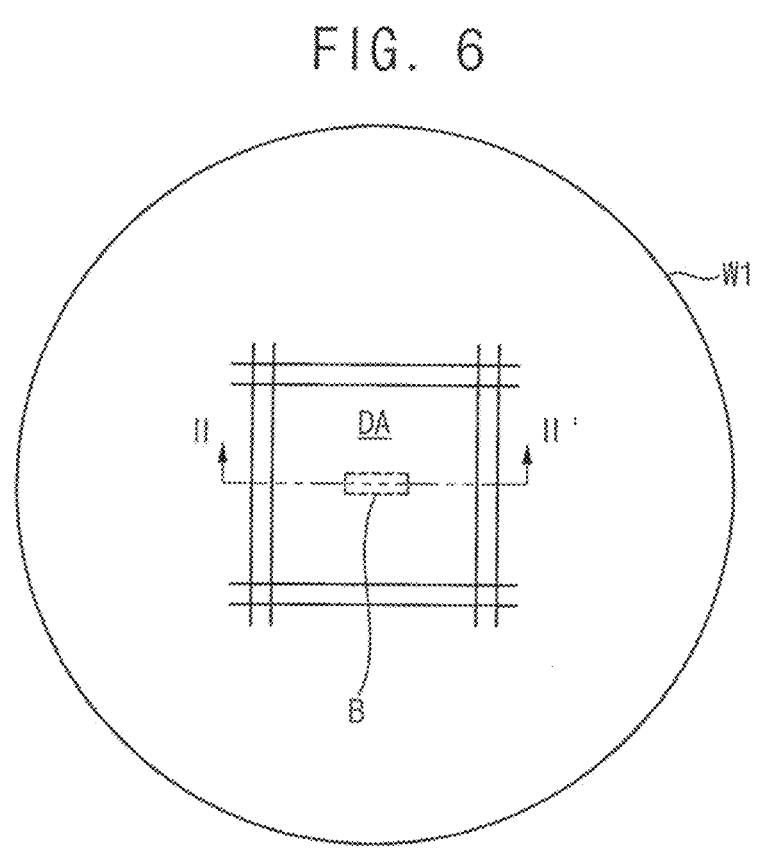

FIG. 5 is a cross-sectional view illustrating transmission paths of data input/output (I/O) signals in a semiconductor package according to a comparative embodiment.

Referring to FIG. 5, a base chip 500 may access any one of the second, third and fourth semiconductor chips 600b, 600c and 600d by way of at least some of first to third through electrodes 650a, 650b and 650c, and data input/output signals from the second, third and fourth semiconductor chips 600b, 600c and 600d may be transmitted to the base chip 500 by way of at least some of the first to third through electrodes 650a, 650b and 650c.

In particular, a signal from an I/O circuitry 618d of the fourth semiconductor chip 600d may be transmitted to the base chip 500 through the third through electrode 650c of the third semiconductor chip 600c, the second through electrode 650b of the second semiconductor chip 600b and the first through electrode 650a of the first semiconductor chip 600a. The third through electrode 650c of the third semiconductor chip 600c, the second through electrode 650b of the second semiconductor chip 600b and the first through electrode 650a of the first semiconductor chip 600a may serve as an I/O signal path which connects between the I/O circuitry 618d of the fourth semiconductor chip 600d and the base chip 500.

A signal from an I/O circuitry 618c of the third semiconductor chip 200c may be transmitted to the base chip 500 through the second through electrode 650b of the second semiconductor chip 600b and the first through electrode 650a of the first semiconductor chip 600a. The second through electrode 650b of the second semiconductor chip 600b and the first through electrode 650a of the first semiconductor chip 600a may serve as an I/O signal path which connects between the I/O circuitry 618c of the third semiconductor chip 200c and the base chip 500.

A signal from an I/O circuitry 618a of the second semiconductor chip 600b may be transmitted to the base chip 500 through the first through electrode 650a of the first semiconductor chip 200a. The first through electrode 650a of the first semiconductor chip 200a may serve as an I/O signal path which connects between the I/O circuitry 618a of the second semiconductor chip 600b and the base chip 500.

In the semiconductor package according to the comparative embodiment, point-to-point connections may be formed between the base chip 500 and the first to fourth semiconductor chips 600a, 600b, 600c and 600d as illustrated in FIG. 4. However, the semiconductor package according to the comparative embodiment may have a structure in which the first to third through electrodes 650a, 650b and 650c are connected to the respective I/O circuitry on the same chip. Further, the semiconductor package according to the comparative embodiment may have a structure in which bonding pads of each, or one or more, semiconductor chip are connected to the respective I/O circuitry on the same chip.

In the semiconductor package 10 illustrated in FIG. 4, the I/O circuit region in which the I/O circuitry is formed is provided around a region in which the first group of through electrodes is formed, while since the second group of through electrodes is not connected to the I/O circuitry, an additional I/O circuit region may not be provided around the region in which the second group of through electrodes is formed. In contrast, the semiconductor package according to the comparative embodiment illustrated in FIG. 5 may include only through electrodes connected to the I/O circuitry on the same chip. That is, the first group of through electrodes of the I/O through electrodes of the semiconductor package according to some example embodiments illustrated in FIG. 4 may be connected to the I/O circuitry on the same semiconductor chip, but the second group of through electrodes of the I/O through electrodes arranged between the first group of through electrodes may not be connected to any I/O circuitry on the same semiconductor chip. In contrast, all I/O through electrodes of the semiconductor package according to the comparative embodiment illustrated in FIG. 5 may be respectively connected to the I/O circuitry on the same semiconductor chip.

Accordingly, in the semiconductor package according to some example embodiments, since the I/O circuitry are provided to be connected to only some of the through electrodes among all the I/O through electrodes, spaces for the I/O circuitry may be reduced to thereby reduce the pitches between the I/O through electrodes.

For example, the semiconductor package according to the comparative embodiment illustrated in FIG. 5 has four I/O channels in the first direction in a given region, whereas the semiconductor package 10 illustrated in FIG. 4 may have at least twice (8) I/O channels in the first direction in the same region. Accordingly, the semiconductor package 10 illustrated in FIG. 4 may provide an input/output (TSV I/O) structure having a larger number of through silicon vias compared to the semiconductor package according to the comparative embodiment, to thereby implement a broadband interface.

As mentioned above, the semiconductor package 10 according to some example embodiments may include the first to fourth semiconductor chips 200a, 200b, 200c and/or 200d sequentially stacked on one another, each, or one or more, of the first, second and/or third semiconductor chips 200a, 200b and 200c may include the first group of through electrodes 252a, 252b, 252c and/or 252d and/or the second group of through electrodes 253a, 253b, 253c and/or 253d alternately arranged in the first direction. The first group of through electrodes may be selectively connected to an I/O circuitry of each, or one or more, semiconductor chip. The second group of through electrodes may not be connected to the I/O circuitry.

Since the second group of through electrodes is not connected to the I/O circuitry, an additional I/O circuit region may not be formed around the region in which the second group of through electrodes is formed. Accordingly, the pitch between the data input/output (I/O) through electrodes may be reduced. Thus, the semiconductor package 10 may provide an input/output (TSV I/O) structure having a larger number of through silicon vias to thereby implement a broadband interface.

Hereinafter, a method of manufacturing the semiconductor package in FIG. 1 will be explained.

Figure 9:
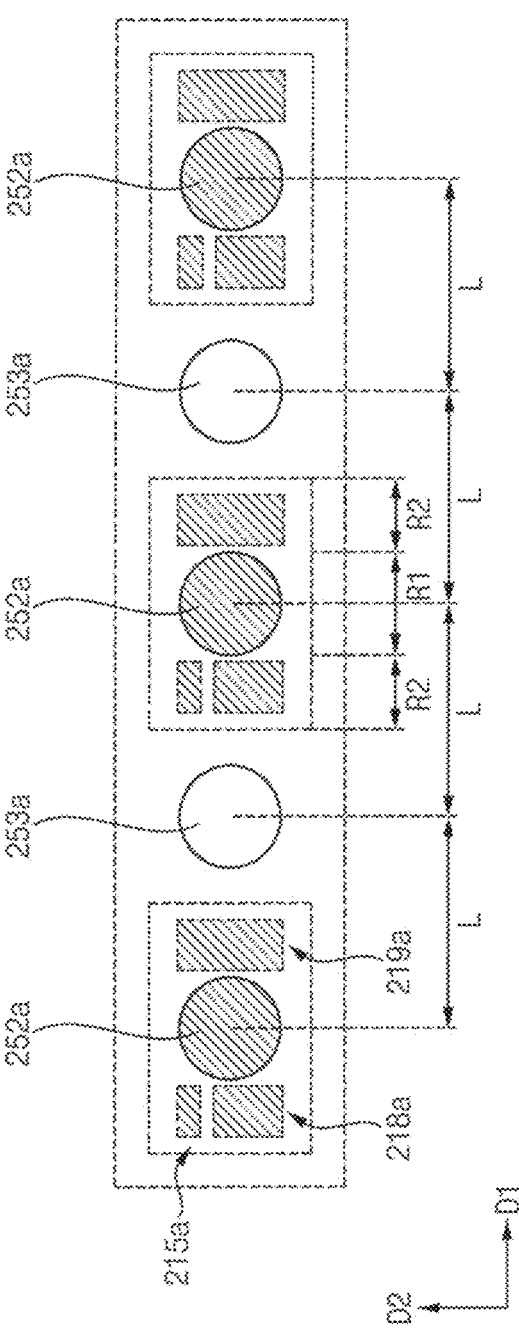
Figure 10:
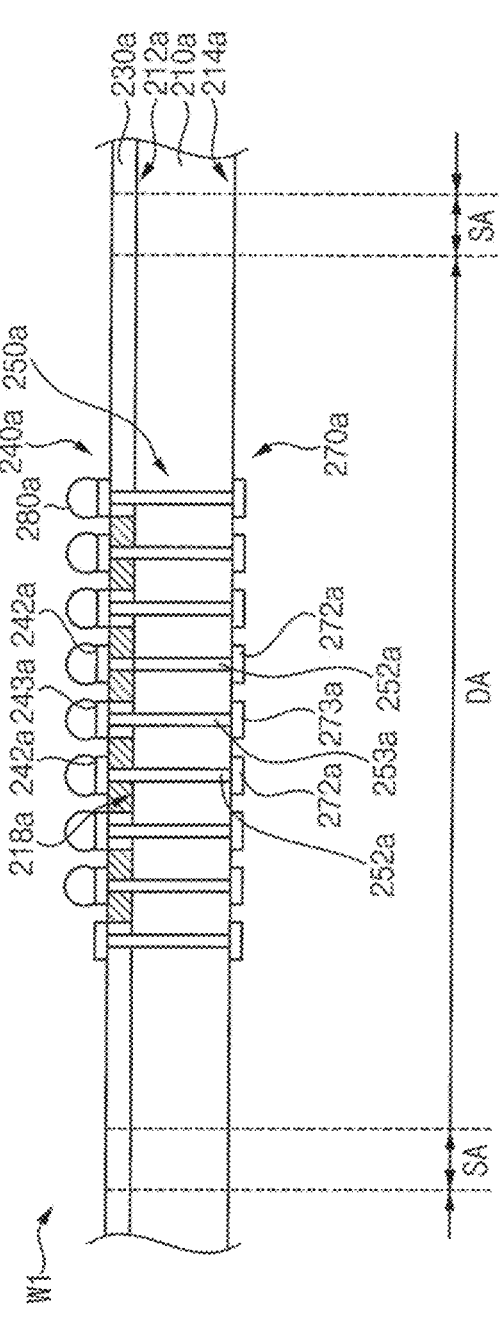

FIGS. 6 to 17 are views illustrating a method of manufacturing a semiconductor package in accordance with some example embodiments. FIGS. 7 and 10 are cross-sectional views taken along the line II-II' in FIG. 6. FIG. 8 is an enlarged cross-sectional view illustrating portion 'C' in FIG. 7. FIG. 9 is an enlarged plan view illustrating portion 'B' in FIG. 6.

Referring to FIGS. 6 to 9, first, a first wafer W1 including a plurality of first semiconductor chips formed therein may be prepared.

In some example embodiments, the first wafer W1 may include a first substrate 210a, a first front insulation layer 230a having first bonding pads 240a provided in an outer surface thereof, and/or a first backside insulation layer 260a. Additionally, the first wafer W1 may include first through electrodes 250a that are provided in the first substrate 210a and electrically connect the first and second bonding pads 240a and 270a to each other.

The first substrate 210a may have a first surface 212a and a second surface 214a opposite to each other. The first substrate 210a may include a die region DA where circuit patterns and cells are formed and a scribe lane region SA surrounding the die region DA. The first substrate 210a may be sawed along the scribe lane region SA dividing the die regions DA of the first wafer W1 by a following singulation process to form an individual semiconductor chip.

For example, the first substrate 210a may include silicon, germanium, silicon-germanium, and/or III-V compounds, e.g., GaP, GaAs, GaSb, etc. In some embodiments, the first substrate 210a may be a silicon-on-insulator (SOI) substrate, or a germanium-on-insulator (GOI) substrate.

The circuit patterns may include a transistor, a capacitor, a diode, etc. The circuit patterns may constitute circuit elements. Accordingly, the first semiconductor chip may be a semiconductor device including a plurality of the circuit elements formed therein. The circuit patterns may be formed by performing a front end of line (FEOL) process for manufacturing a semiconductor device on the first surface 212a of the first substrate 210a. The surface of the first substrate on which the FEOL process is performed may be referred to as a front surface of the first substrate, and a surface opposite to the front surface may be referred to as a backside surface.

The first front insulation layer 230a may be formed as an insulation interlayer on the first surface 212a, e.g., the front surface of the first substrate 210a. The first front insulation layer 230a may include a plurality of insulation layers and wirings in the insulation layers. The first bonding pads 240a may be provided in the outermost insulation layer of the first front insulation layer 230a.

As illustrated in FIG. 8, for example, the first front insulation layer 230a may include a first insulation interlayer 220a and/or a second insulation interlayer 222a.

The first insulation interlayer 220a may be provided on the first surface 212a of the first substrate 210a and may cover the circuit patterns 216a on the first surface 212a of the first substrate 210a. The first insulation interlayer 220a may include, for example, silicon oxide and/or a low dielectric material. The first insulation interlayer 220a may include lower wirings 217a in the first insulation interlayer 220a.

The second insulation interlayer 222a may include buffer layers and insulation layers stacked alternately on one another. For example, the buffer layer may include silicon nitride, silicon carbon nitride (SiCN), and/or silicon carbon oxynitride (SiCON), etc. The insulation layer may include silicon oxide, carbon doped silicon oxide, and/or silicon carbon nitride (SiCN), etc.

The second insulation interlayer 222a may include a plurality of metal wirings 226a therein. For example, the metal wiring 226a of the second insulation interlayer 222a may include metal lines and/or contacts electrically connected to each other. The first bonding pads 240a may be provided in the outermost insulation layer of the second front insulation layer 230a. The first bonding pads 240a may be exposed through an outer surface of the second front insulation layer 230a.

Accordingly, the circuit pattern 216a may be electrically connected to the first bonding pad 240a by the lower wirings and the wirings.

The first through electrode 250a may penetrate through the first insulation interlayer 220a and extend from the first surface 212a to the second surface 214a of the first substrate 210a. The first through electrode 250a may be electrically connected to the first bonding pad 240a by the wirings 226a.

A liner layer 251a may be provided on an outer surface of the first through electrode 250a. The liner layer may include silicon oxide and/or carbon doped silicon oxide. The liner layer 251a may insulate electrically the first substrate 210a and/or the first front insulation layer 230a from the first through electrode 250a.

The first backside insulation layer 260a may be formed on the second surface 214a, e.g., the backside surface of the first substrate 210a. The second bonding pads 270a may be provided in the first backside insulation layer 260a. The second bonding pads 270a may be arranged on an exposed surface of the first through electrode 250a. The first backside insulation layer 260a may include silicon oxide, carbon doped silicon oxide, and/or silicon carbon nitride (SiCN), etc. Accordingly, the first and second bonding pads 240a and 270a may be electrically connected to each other by the first through electrode 250a.

For example, the first through electrode 250a may be formed to penetrate through the first insulation interlayer 240a and extend to a predetermined (or alternately given) depth from the first surface 212a of the first substrate 210a (via middle process), the backside surface of the first substrate 210a, e.g., the second surface 214a may be grinded until end portions of the first through electrodes 250a are exposed, and then, the second backside insulation layer 260a having the second bonding pads 270a electrically connected to the exposed end portions of the first through electrodes 250a respectively may be formed on the second surface 214a of the first substrate 210a.

As illustrated in FIGS. 8 and 9, the first and second bonding pads 240a and 270a may be arranged in respective pad arrays on the upper surface and the lower surface of the first semiconductor chip, and the first through electrodes 250a may be arranged in first regions R1 of the first substrate 210a in an array. The via array of the first through electrodes 250a may be designed to correspond to the pad arrays of the first and second bonding pads 240a and 270a.

The first through electrodes 250a may include a first group of through electrodes 252a and/or a second group of through electrodes 253a alternately arranged in a first direction D1. The first group of through electrodes 252a may be arranged to be spaced apart from each other in the first direction D1. The second group of through electrodes 253a may be arranged to be spaced apart from each other in the first direction D2. Each, or one or more, of the second group of through electrodes 253a may be arranged between the first group of through electrodes 252a adjacent to each other. Although it is not illustrated in the figures, the first through electrodes may include first and/or second groups of through electrodes alternately arranged in a second direction D2 perpendicular to the first direction D1.

For example, a distance 2 L between the adjacent first through electrodes 252a of the first group may be equal to a distance 2 L between the adjacent through electrodes 253a of the second group. A distance L between the through electrode 252a of the first group and the through electrode 253a of the second group adjacent to each other may be half of the distance 2 L between the adjacent through electrodes 252a of the first group.

The first bonding pads 240a may include a first group of bonding pads 242a electrically connected to the first group of through electrodes 252a respectively and/or a second group of bonding pads 243a electrically connected to the second group of through electrodes 253a respectively. The first group of bonding pads 242a and the second group of bonding pads 243a may be alternately arranged in the first direction D1.

The second bonding pads 270a may include a first group of bonding pads 272a electrically connected to the first group of through electrodes 252a respectively and/or a second group of bonding pads 273a electrically connected to the second group of through electrodes 253a respectively. The first group of bonding pads 272a and the second group of bonding pads 273a may be alternately arranged in the first direction D1.

In some example embodiments, the circuit pattern 216a may include an input/output (I/O) circuitry 218a for transmitting data signals and an electrostatic discharge circuitry 219a associated with the I/O circuitry 218a. Each, or one or more, of the first group of through electrodes 252a and/or the second group of through electrodes 253a may be used as a portion of an input/output (I/O) path through which the data signals are transmitted. The first and second bonding pads 240a and 270a electrically connected to each other by the first group of through electrodes 252a and the second group of through electrodes 253a, respectively, may be used as input/output (I/O) pads.

Although it is not illustrated in the figures, the first semiconductor chip may further include control signal through electrodes for transmitting control signals such as address and command, and control signal pads electrically connected to the control signal through electrodes.

In some example embodiments, the first group of through electrodes 252a and/or the first group of bonding pads 242a and/or 272a may be selectively connected to the I/O circuitry 218a. The second group of through electrodes 253a and/or the second group of bonding pads 243a and/or 273a may not be connected to the I/O circuitry. The circuit pattern 216a may further include a fuse portion 215a capable of electrically decoupling the I/O circuitry 218a from the first group of through electrodes 252a and the first group of bonding pads 242a and 272a. For example, the fuse portion may include a programmable fuse or an anti-fuse. Accordingly, the I/O circuitry 218a may be selectively connected to or disconnected from the first group of through electrodes 252a and the first group of connection pads 242a and 272a by the fuse portion.

As illustrated in FIG. 9, a second region R2 in which the I/O circuitry 218a and/or the electrostatic discharge circuitry 219a are formed may be provided around the first region R1 in which the first group of through electrodes 252a are formed. The first region R1 may be a TSV region, and the second region R2 may be an I/O circuit region. Since the second group of through electrodes 253a is not connected to the I/O circuitry, an additional I/O circuit region may not be provided around the region in which the second group of through electrodes 253a is formed.

Accordingly, after arranging the first group of through electrodes 252a, the second group of through electrodes 253a may be arranged between the first group of through electrodes 252a while maintaining the array of the first group of through electrodes 252a as it is. Thus, an input/output (TSV I/O) structure having a large number of through silicon vias may be provided, to thereby implement a broadband interface.

Referring to FIG. 10, first conductive connection members 280a may be formed on the first bonding pads 240a on the first surface 212a of the first substrate 210a.

In particular, a seed layer may be formed on the first bonding pads 240a on the first surface 212a of the first substrate 210a, a photoresist pattern having openings that expose portions of the seed layer may be formed, a conductive material may be formed to fill the openings of the photoresist pattern, the photoresist pattern may be removed, and then, a reflow process may be performed to form bumps as the first conductive connection members 280a. For example, the conductive material may be formed on the seed layer by an electroplating process. Alternatively, the bump may be formed by a screen printing process, and/or a deposition process, etc. The first conductive connection member may include a solder bump.

Figure 11:
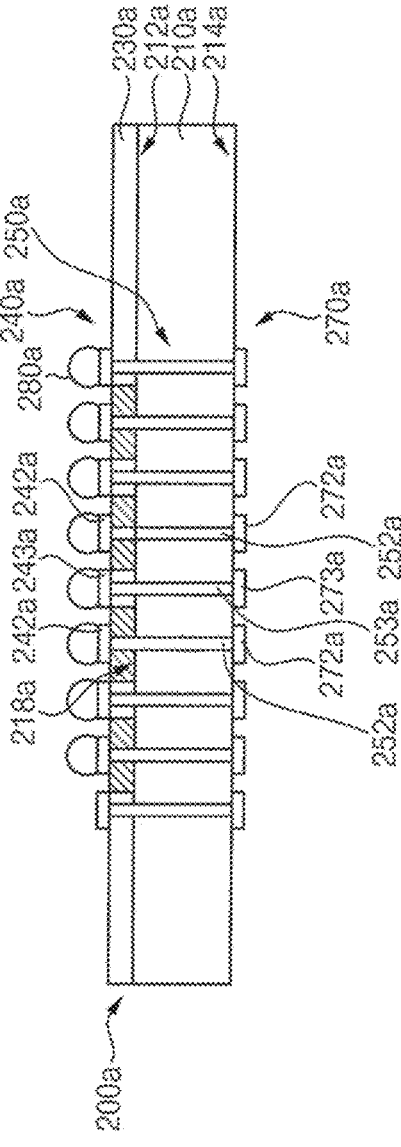

Referring to FIG. 11, the first wafer W1 may be cut along the scribe lane region SA to form an individual first semiconductor chip 200a.

Figure 12:
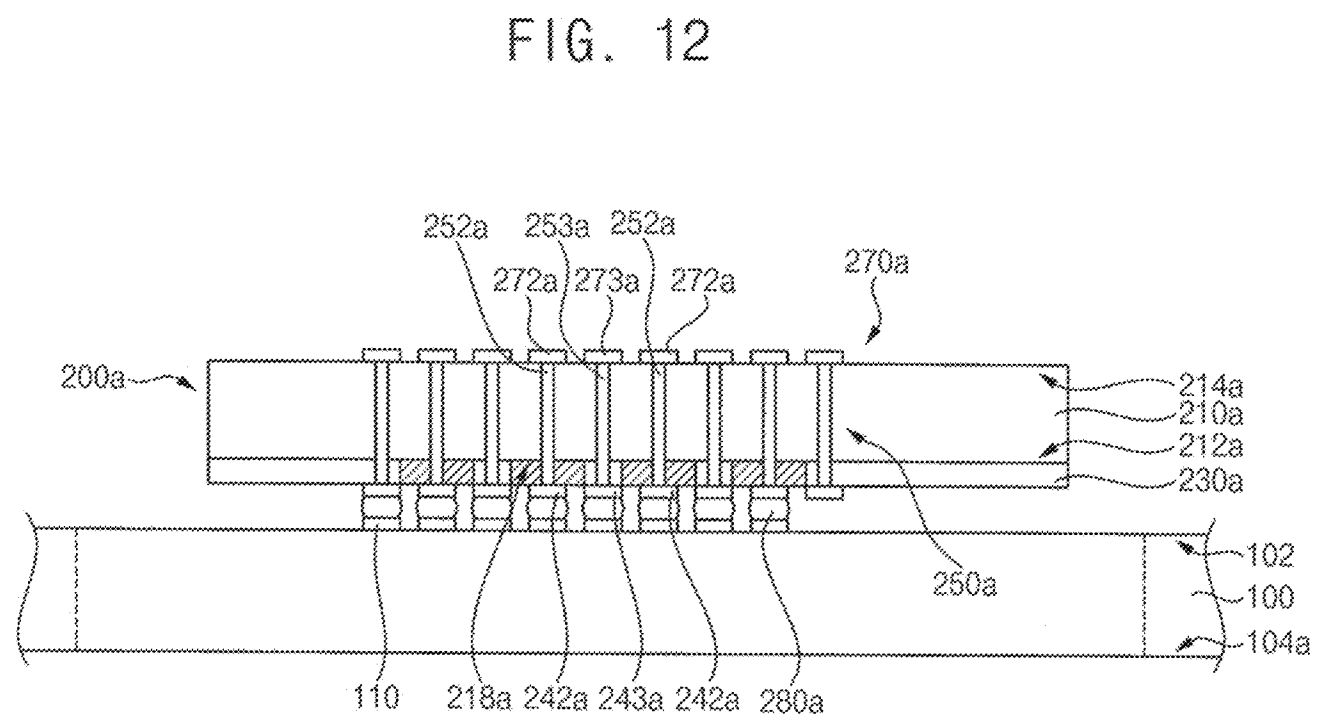

Referring to FIG. 12, the first semiconductor chip 200a may be stacked on a base substrate 100 using a substrate support system WSS. After attaching the base substrate 100 to a carrier substrate using an adhesive film, the first semiconductor chip 200a may be stacked on the base substrate 100.

The base substrate 100 may include a semiconductor die region in which an integrated circuit is integrated. The base substrate 100 may include a buffer die serving as a processor for controlling a memory device. Alternatively, the base substrate 100 may include an interposer having wires for electrical connection with a processor chip.

The base substrate 100 may have an upper surface 102 and a lower surface 104 opposite to each other. Substrate pads 110 for electrical connection with the first semiconductor chip 200a may be provided on the upper surface 102 of the base substrate 100. Outer connection pads for electrical connection with an external device may be provided on the lower surface 104 of the base substrate 100.

The first semiconductor chip 200a may be stacked on the base substrate 100 through the first conductive connection members 280a. The first semiconductor chip 200a may be arranged on the base substrate 100 such that the first bonding pad 240a of the first semiconductor chip 200a faces the substrate pad 110 of the base substrate 100.

The first conductive connection members 280a may be interposed between the base substrate 100 and the first semiconductor chip 200a. The first conductive connection member 280a may electrically connect the substrate pad 110 of the base substrate 100 and the first bonding pad 240a of the first semiconductor chip 200a.

Figure 13:
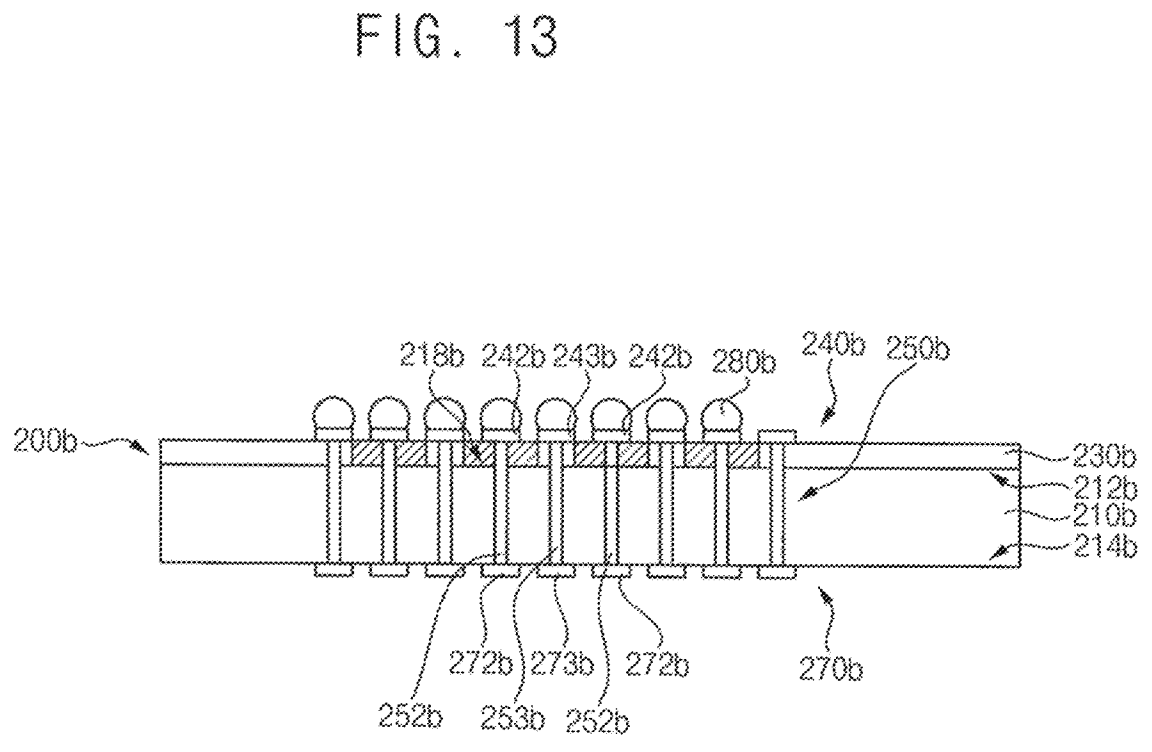
Figure 14:
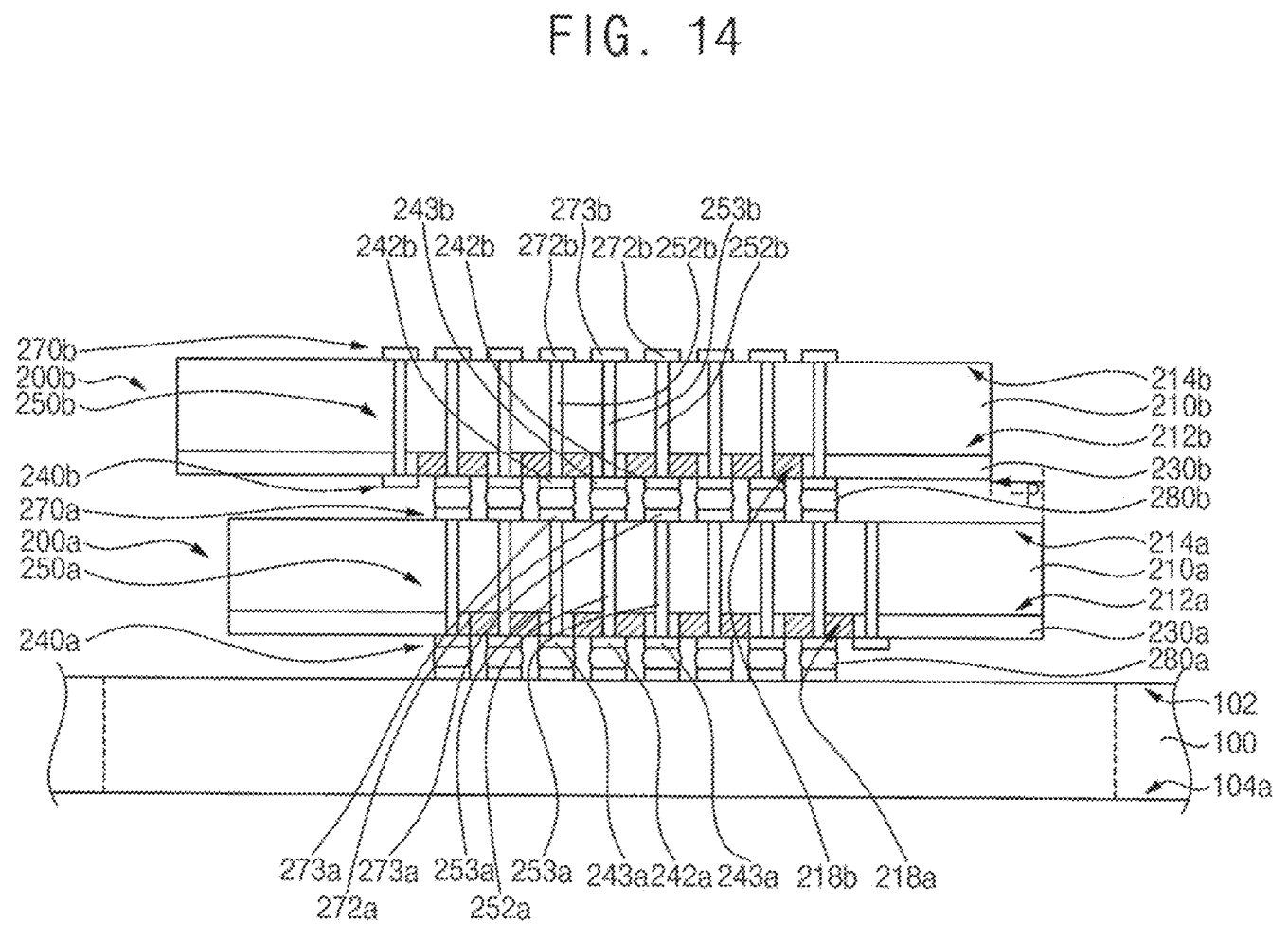

Referring to FIGS. 13 and 14, a second semiconductor chip 200b may be stacked on the first semiconductor chip 200a.

First, processes the same as or similar to those described with reference to FIGS. 6 to 11 may be performed to form an individualized second semiconductor chip 200b, and the second semiconductor chip 200b may be stacked on the first semiconductor chip 200a.

As illustrated in FIG. 13, the second semiconductor chip 200b may be identical to the first semiconductor chip 200a in terms of structural form. For example, an arrangement of through electrodes and/or an arrangement of bonding pads of the second semiconductor chip 200b may be the same as the arrangement of the through electrodes and/or the arrangement of the bonding pads of the first semiconductor chip 200a. However, the second semiconductor chip 200b may be somewhat different from the first semiconductor chip 200a in terms of functionality. Employing semiconductor chips having the same structure in the stack may provide advantages in terms of manufacturing cost.

The second semiconductor chip 200b may include a second substrate 210b, a second front insulation layer 230b having third bonding pads 240b on an outer surface thereof, a second backside insulation layer 260b having fourth bonding pads 270b therein, and/or second through electrodes 250b provided in the second substrate 210b and electrically connecting the third and fourth bonding pads 240b and 270b to each other.

The second through electrodes 250b may include a first group of through electrodes 252b and/or a second group of through electrodes 253b alternately arranged in the first direction D1. The first group of through electrodes 252b may be selectively connected to an I/O circuitry 218b. The second group of through electrodes 253b may not be connected to the I/O circuitry 218b.

The third bonding pads 240b may include a first group of bonding pads 242b electrically connected to the first group of through electrodes 252b respectively and/or a second group of bonding pads 243b electrically connected to the second group of through electrodes 253b respectively. The first group of bonding pads 242b and the second group of bonding pads 243b of the third bonding pads 240b may be alternately arranged in the first direction D1.

The fourth bonding pads 270b may include a first group of bonding pads 272b electrically connected to the first group of through electrodes 252b respectively and/or a second group of bonding pads 273b electrically connected to the second group of through electrodes 253b respectively.

The first group of bonding pads 272b and the second group of bonding pads 273b of the fourth bonding pads 270b may be alternately arranged in the first direction D1.

As illustrated in FIG. 14, the second semiconductor chip 200b may be stacked on the first semiconductor chip 200a through second conductive connection members 280b. The second semiconductor chip 200b may be arranged on the first semiconductor chip 200a such that the third bonding pad 240b of the second semiconductor chip 200b faces the second bonding pad 270a of the first semiconductor chip 200a.

The second conductive connection members 280b may be interposed between the first semiconductor chip 200a and the second semiconductor chip 200b. The second conductive connection member 280b may electrically connect the second bonding pad 270a of the first semiconductor chip 200b and the third bonding pad 240b of the second semiconductor chip 200b.

In some example embodiments, the second semiconductor chip 200b may be offset from the first semiconductor chip 200a by a preset (or alternately given) interval (−P) in the first direction such that the first group of through electrodes 252b of the second semiconductor chip 200b are electrically connected to the second group of through electrodes 253a of the first semiconductor chip 200a, respectively, and/or the second group of through electrodes 253b of the second semiconductor chip 200b are electrically connected to the first group of through electrodes 252a of the first semiconductor chip 200a, respectively. The preset (or alternately given) interval may be a distance between adjacent through electrodes, for example, a pitch.

The first group of bonding pads 242b of the third bonding pads 240b of the second semiconductor chip 200b may be electrically connected to the second group of bonding pads 273a of the second bonding pads 270a of the first semiconductor chip 200a, respectively, and the second group of bonding pads 243b of the third bonding pads 240b of the second semiconductor chip 200b may be electrically connected to the first group of bonding pads 272a of the second bonding pads 270a of the first semiconductor chip 200a, respectively.

Figure 15:
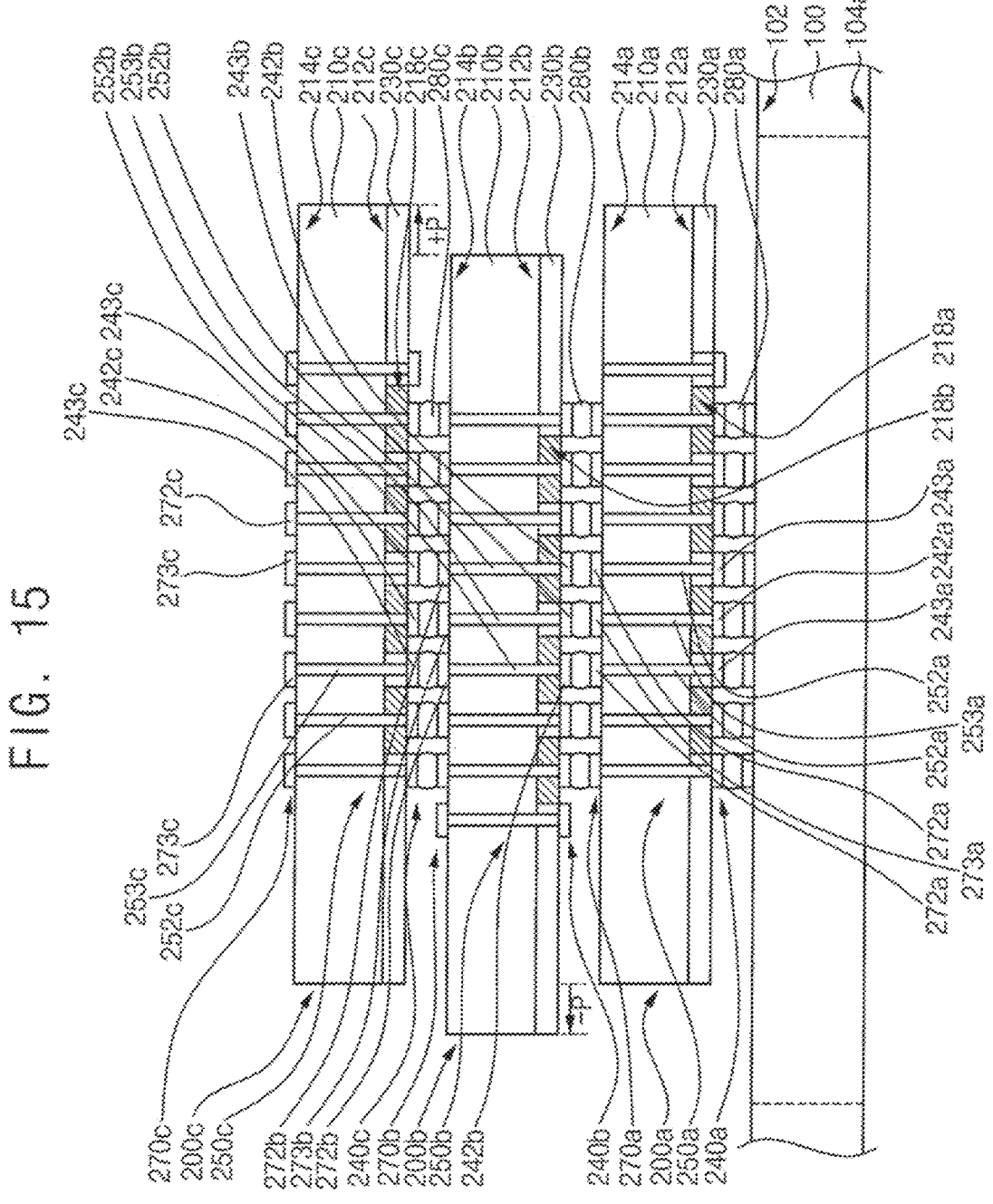

Referring to FIG. 15, a third semiconductor chip 200c may be stacked on the second semiconductor chip 200b.

First, processes the same as or similar to those described with reference to FIGS. 6 to 11 may be performed to form an individualized third semiconductor chip 200c, and the third semiconductor chip 200c may be stacked on the second semiconductor chip 200b.

In some example embodiments, the third semiconductor chip 200c may be identical to the first and/or second semiconductor chips 200a and 200b in terms of structural form. For example, an arrangement of through electrodes and/or an arrangement of bonding pads of the third semiconductor chip 200c may be the same as the arrangement of the through electrodes and the arrangement of the bonding pads of the first and second semiconductor chips 200a and 200b. However, the third semiconductor chip 200c may be somewhat different from the first and/or second semiconductor chips 200a and 200b in terms of functionality. Employing semiconductor chips having the same structure in the stack may provide advantages in terms of manufacturing cost.

The third semiconductor chip 200c may include a third substrate 210c, a third front insulation layer 230c having fifth bonding pads 240c on an outer surface thereof, a third backside insulation layer having sixth bonding pads 270c therein, and/or third through electrodes 250c provided in the third substrate 210*c* and electrically connecting the fifth and sixth bonding pads 240*c* and 270*c* to each other.

The third through electrodes 250*c* may include a first group of through electrodes 252*c* and/or a second group of through electrodes 253*c* alternately arranged in the first direction. The first group of through electrodes 252*c* may be selectively connected to an I/O circuitry 218*b*. The second group of through electrodes 253*c* may not be connected to the I/O circuitry 218*b*.

The fifth bonding pads 240*c* may include a first group of bonding pads 242*c* electrically connected to the first group of through electrodes 252*c* respectively and/or a second group of bonding pads 243*c* electrically connected to the second group of through electrodes 253*c* respectively. The first group of bonding pads 242*c* and the second group of bonding pads 243*c* of the fifth bonding pads 240*c* may be alternately arranged in the first direction D1.

The sixth bonding pads 270*c* may include a first group of bonding pads 272*c* electrically connected to the first group of through electrodes 252*c* respectively and/or a second group of bonding pads 273*c* electrically connected to the second group of through electrodes 253*c* respectively. The first group of bonding pads 272*c* and the second group of bonding pads 273*c* of the sixth bonding pads 270*c* may be alternately arranged in the first direction D1.

As illustrated in FIG. 15, the third semiconductor chip 200*c* may be stacked on the second semiconductor chip 200*b* through third conductive connection members 280*c*. The third semiconductor chip 200*c* may be arranged on the second semiconductor chip 200*b* such that the fifth bonding pad 240*c* of the third semiconductor chip 200*c* faces the fourth bonding pad 270*b* of the second semiconductor chip 200*b*.

The third conductive connection members 280*c* may be interposed between the second semiconductor chip 200*b* and the third semiconductor chip 200*c*. The third conductive connection member 280*c* may electrically connect the fourth bonding pad 270*b* of the second semiconductor chip 200*b* and the fifth bonding pad 240*c* of the third semiconductor chip 200*c*.

In some example embodiments, the third semiconductor chip 200*c* may be offset from the second semiconductor chip 200*b* by a preset (or alternately given) interval (+P) in a reverse direction of the first direction such that the first group of through electrodes 252*c* of the third semiconductor chip 200*c* are electrically connected to the second group of through electrodes 253*b* of the second semiconductor chip 200*b*, respectively, and/or the second group of through electrodes 253*c* of the third semiconductor chip 200*c* are electrically connected to the first group of through electrodes 252*b* of the second semiconductor chip 200*b*, respectively. The preset (or alternately given) interval may be a distance between adjacent through electrodes, for example, a pitch.

The first group of bonding pads 242*c* of the fifth bonding pads 240*c* of the third semiconductor chip 200*c* may be electrically connected to the second group of bonding pads 273*b* of the fourth bonding pads 270*b* of the second semiconductor chip 200*b*, respectively, and/or the second group of bonding pads 243*c* of the fifth bonding pads 240*c* of the third semiconductor chip 200*c* may be electrically connected to the first group of bonding pads 272*b* of the second bonding pads 270*b* of the second semiconductor chip 200*b*, respectively.

Figure 16:
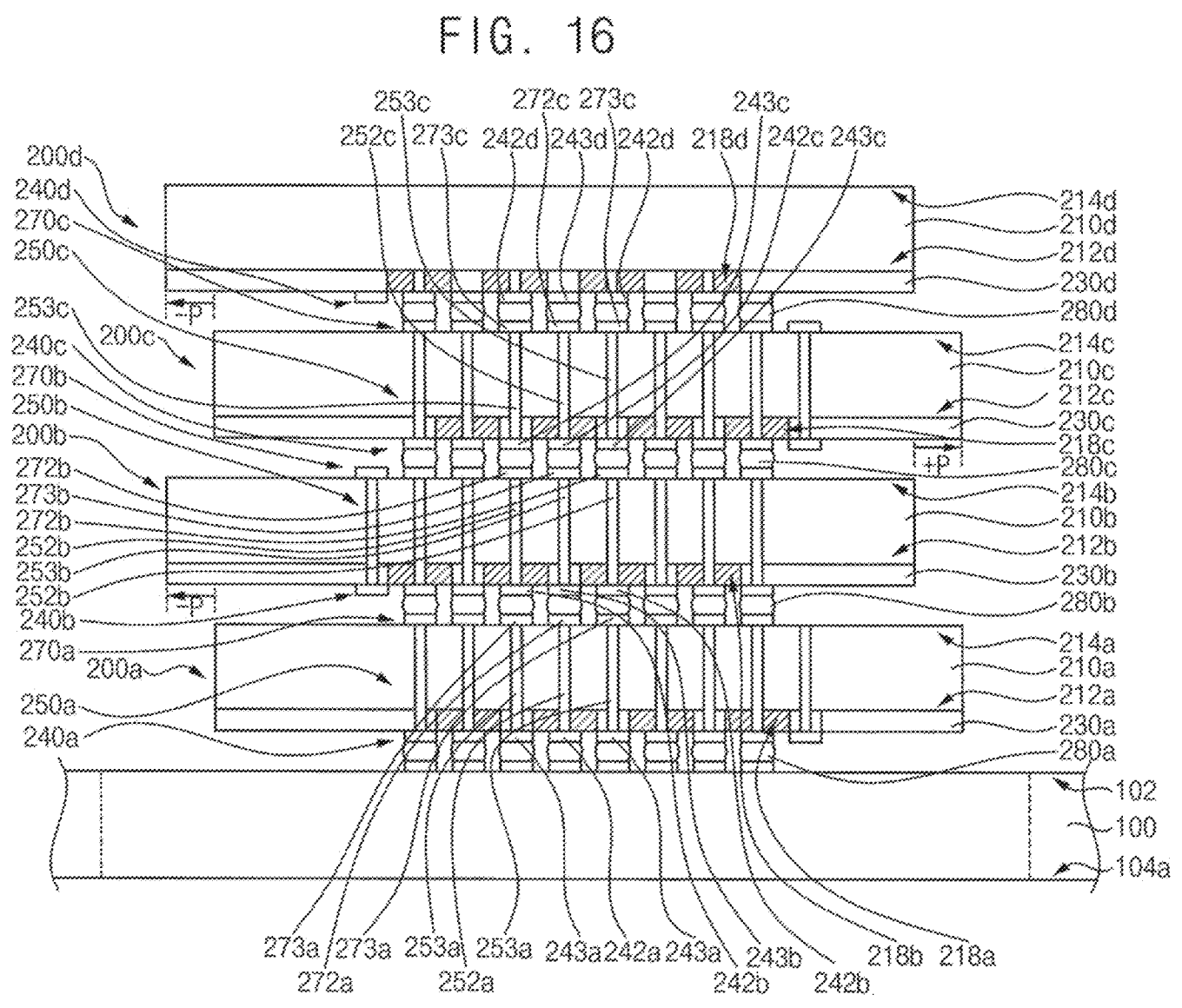

Referring to FIG. 16, a fourth semiconductor chip 200*d* may be stacked on the third semiconductor chip 200*c*.

First, processes the same as or similar to those described with reference to FIGS. 6 to 11 may be performed to form an individualized fourth semiconductor chip 200*d*, and the fourth semiconductor chip 200*d* may be stacked on the third semiconductor chip 200*c*.

In some example embodiments, the fourth semiconductor chip 200*c* may be identical to the first, second and/or third semiconductor chips 200*a*, 200*b* and 200*c* in terms of structural form. For example, an arrangement of through electrodes and/or an arrangement of bonding pads of the fourth semiconductor chip 200*d* may be the same as the arrangement of the through electrodes and/or the arrangement of the bonding pads of the first, second and/or third semiconductor chips 200*a*, 200*b* and 200*c*.

The fourth semiconductor chip 200*d* may include a fourth substrate 210*d* and/or a fourth front insulation layer 230*d* having seventh bonding pads 240*d* on an outer surface thereof.

The seventh bonding pads 240*d* may include a first group of bonding pads 242*d* and/or a second group of bonding pads 243*d* alternately arranged in the first direction. The first group of bonding pads 242*d* may be selectively connected to an I/O circuitry 218*b*. The second group of bonding pads 243*d* may not be connected to the I/O circuitry 218*b*.

As illustrated in FIG. 16, the fourth semiconductor chip 200*d* may be stacked on the third semiconductor chip 200*c* through fourth conductive connection members 280*d*. The fourth semiconductor chip 200*d* may be arranged on the third semiconductor chip 200*c* such that the seventh bonding pad 240*d* of the fourth semiconductor chip 200*d* faces the sixth bonding pad 270*c* of the third semiconductor chip 200*c*.

The fourth conductive connection members 280*d* may be interposed between the third semiconductor chip 200*c* and the fourth semiconductor chip 200*d*. The fourth conductive connection member 280*d* may electrically connect the sixth bonding pad 270*c* of the third semiconductor chip 200*c* and the seventh bonding pad 240*d* of the fourth semiconductor chip 200*d*.

In some example embodiments, the fourth semiconductor chip 200*d* may be offset from the third semiconductor chip 200*c* by a preset (or alternately given) interval (−P) in the first direction such that the first group of bonding pads 242*d* of the seventh bonding pads 240*d* of the fourth semiconductor chip 200*d* are electrically connected to the second group of bonding pads 273*c* of the sixth bonding pads 270*c* of the third semiconductor chip 200*c*, respectively, and/or the second group of bonding pads 243*d* of the seventh bonding pads 240*d* of the fourth semiconductor chip 200*d* are electrically connected to the first group of bonding pads 272*c* of the sixth bonding pads 270*c* of the third semiconductor chip 200*c*, respectively. The preset (or alternately given) interval may be a distance between adjacent through electrodes, for example, a pitch.

Figure 17:
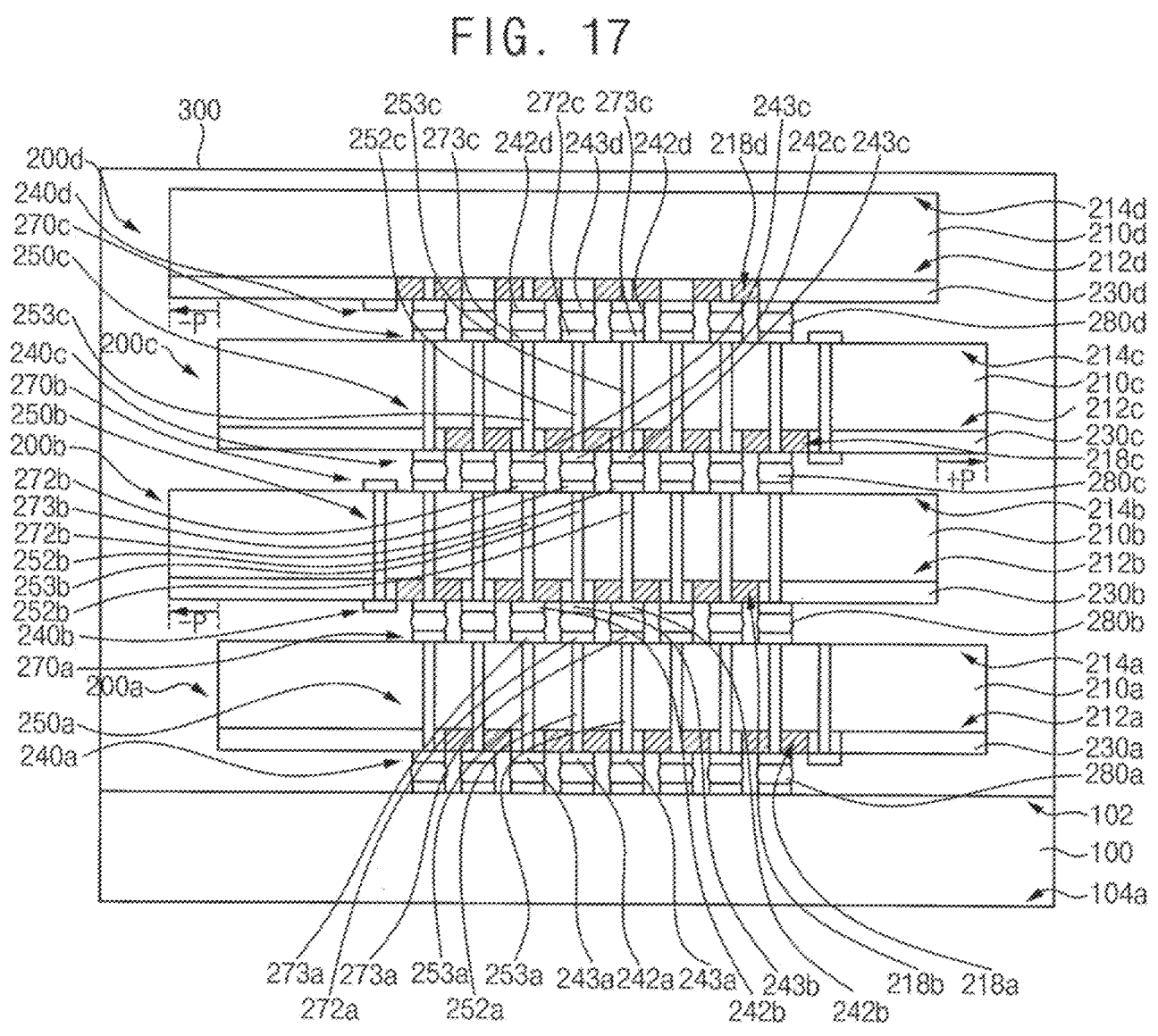

Referring to FIG. 17, a molding member 300 may be formed on the base substrate 100 to cover the first to fourth semiconductor chips 200*a*, 200*b*, 200*c* and/or 200*d*.

In some example embodiments, the molding member 300 may be formed to fill gaps between the base substrate 100 and the first to fourth semiconductor chips 200*a*, 200*b*, 200*c* and/or 200*d*. The molding member 300 may be formed using a polymer material such as epoxy molding compound (EMC).

Alternatively, gaps between the base substrate 100 and the first to fourth semiconductor chips 200*a*, 200*b*, 200*c* and/or 200*d* may be filled by underfill members and/or adhesive films.

Then, the base substrate 100 and the molding member 300 may be cut along a cutting region to complete the semiconductor package 10 in FIG. 1.

Figure 18:
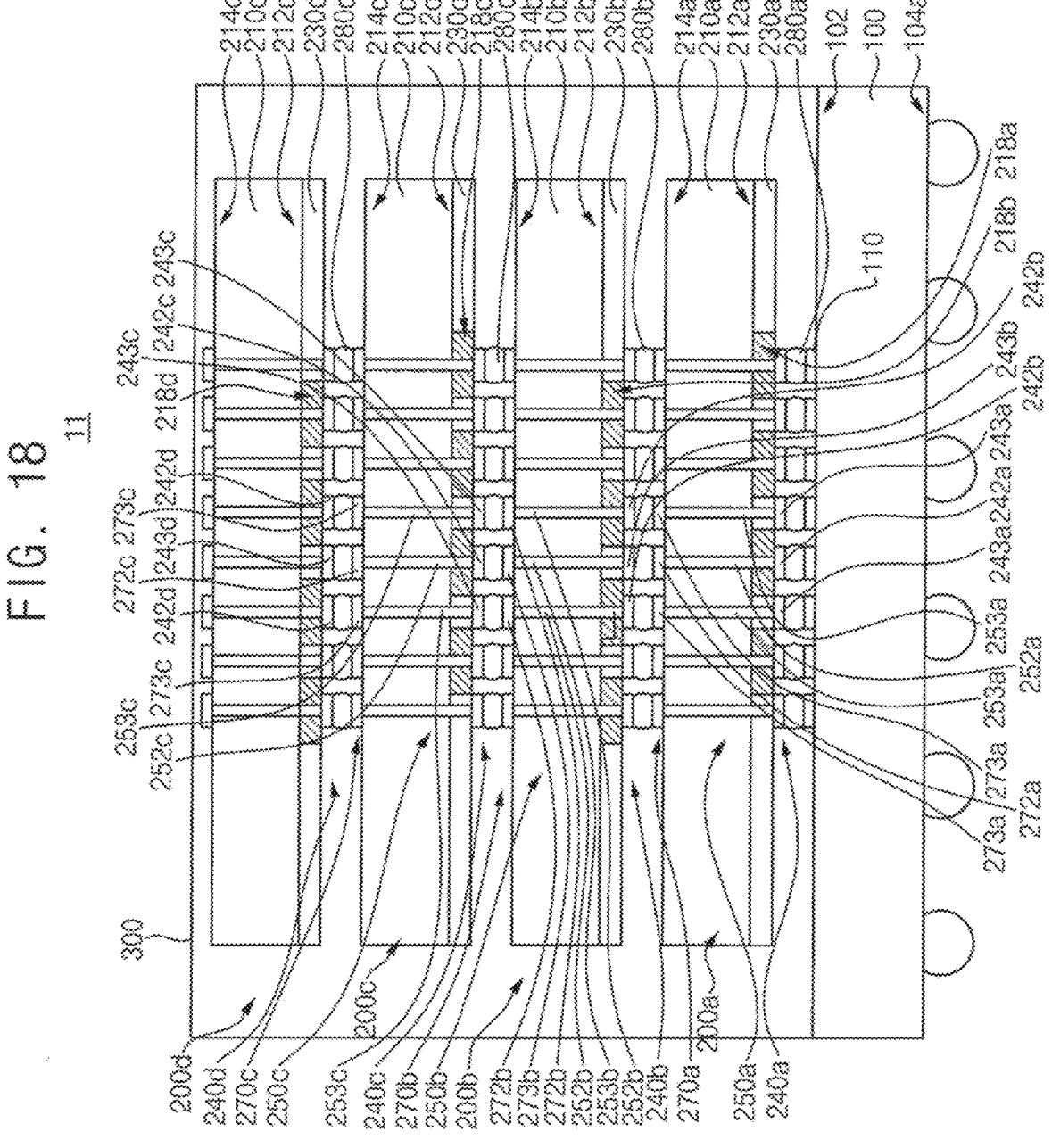

FIG. 18 is a cross-sectional view illustrating a semiconductor package in accordance with some example embodiments. The semiconductor package may be substantially the same as or similar to the semiconductor package described with reference to FIGS. 1 to 3 except for arrangements of pads and through electrodes of first to fourth semiconductor chips. Thus, same reference numerals will be used to refer to the same or like elements and any further repetitive explanation concerning the above elements will be omitted.

Referring to FIG. 18, a semiconductor package 11 may include first to fourth semiconductor chips 200*a*, 200*b*, 200*c* and/or 200*d* sequentially stacked on one another.

In some example embodiments, the second and/or fourth semiconductor chips 200*b* and 200*d* may be identical to the first and/or third semiconductor chips 200*a* and 200*c* in terms of structural form except for arrangements of through electrodes and bonding pads.

First and/or second groups of through electrodes 252*a* and 253*a* of the first semiconductor chip 200*a* and/or first and/or second groups of through electrodes 252*b* and 253*b* of the second semiconductor chip 200*b* may be arranged to change their positions.

For example, when the first group of through electrodes 252*a* of the first semiconductor chip 200*a* is at a first position from the center of the first semiconductor chip 200*a*, the second group of through electrodes 253*b* of the second semiconductor chip 200*b* may be at the same position as the first position from the center of the second semiconductor chip 200*b*. When the second group of through electrodes 253*a* of the first semiconductor chip 200*a* is at a second position from the center of the first semiconductor chip 200*a*, the first group of through electrodes 252*b* of the second semiconductor chip 200*b* may be at the same position as the second position from the center of the second semiconductor chip 200*b*.

When first through electrodes 250*a* of the first semiconductor chip 200*a* and/or second through electrodes 250*b* of the second semiconductor chip 200*b* are disposed to overlap each other, the first group of through electrodes 252*b* of the second semiconductor chip 200*b* may be overlapped with the second group of through electrodes 253*a* of the first semiconductor chip 200*a* respectively and the second group of through electrodes 253*b* of the second semiconductor chip 200*b* may be overlapped with the first group of through electrodes 252*a* of the first semiconductor chip 200*a* respectively.

When the second through electrodes 250*b* of the second semiconductor chip 200*b* and third through electrodes 250*c* of the third semiconductor chip 200*c* are disposed to overlap each other, a first group of through electrodes 252*c* of the third semiconductor chip 200*c* may be overlapped with the second group of through electrodes 253*b* of the second semiconductor chip 200*b* respectively and a second group of through electrodes 253*c* of the third semiconductor chip 200*c* may be overlapped with the first group of through electrodes 252*b* of the second semiconductor chip 200*b* respectively.

When the second through electrodes 250*c* of the third semiconductor chip 200*c* and fourth through electrodes 250*d* of the fourth semiconductor chip 200*d* are disposed to overlap each other, a first group of through electrodes 252*d* of the fourth semiconductor chip 200*d* may be overlapped with the second group of through electrodes 253*c* of the third semiconductor chip 200*c* respectively and a second group of through electrodes 253*d* of the fourth semiconductor chip 200*d* may be overlapped with the first group of through electrodes 252*c* of the third semiconductor chip 200*c* respectively.

For example, the second semiconductor chip 200*b* may be stacked to completely (or substantially) overlap with the first semiconductor chip 200*a* without being offset from the first semiconductor chip 200*a*, the third semiconductor chip 200*c* may be stacked to completely (or substantially) overlap with the second semiconductor chip 200*b* without being offset from the second semiconductor chip 200*b*, and/or the fourth semiconductor chip 200*d* may be stacked to completely (or substantially) overlap with the third semiconductor chip 200*c* without being offset from the third semiconductor chip 200*c*.

The first group of bonding pads 242*b* of the third bonding pads 240*b* of the second semiconductor chip 200*b* may be electrically connected to the second group of bonding pads 273*a* of the second bonding pads 270*a* of the first semiconductor chip 200*a* respectively, and the second group of bonding pads 243*b* of the third bonding pads 240*b* of the second semiconductor chip 200*b* may be electrically connected to the first group of bonding pads 272*a* of the second bonding pads 270*a* of the first semiconductor chip 200*a* respectively.

The first group of bonding pads 242*c* of the fifth bonding pads 240*c* of the third semiconductor chip 200*c* may be electrically connected to the second group of bonding pads 273*b* of the fourth second bonding pads 270*b* of the second semiconductor chip 200*b* respectively, and the second group of bonding pads 243*c* of the fifth bonding pads 240*c* of the third semiconductor chip 200*c* may be electrically connected to the first group of bonding pads 272*b* of the fourth bonding pads 270*b* of the second semiconductor chip 200*b* respectively.

The first group of bonding pads 242*d* of the seventh bonding pads 240*d* of the fourth semiconductor chip 200*d* may be electrically connected to the second group of bonding pads 273*c* of the sixth bonding pads 270*c* of the third semiconductor chip 200*c* respectively, and the second group of bonding pads 243*d* of the seventh bonding pads 240*d* of the fourth semiconductor chip 200*d* may be electrically connected to the first group of bonding pads 272*c* of the sixth bonding pads 270*c* of the third semiconductor chip 200*c* respectively.

Figure 19:
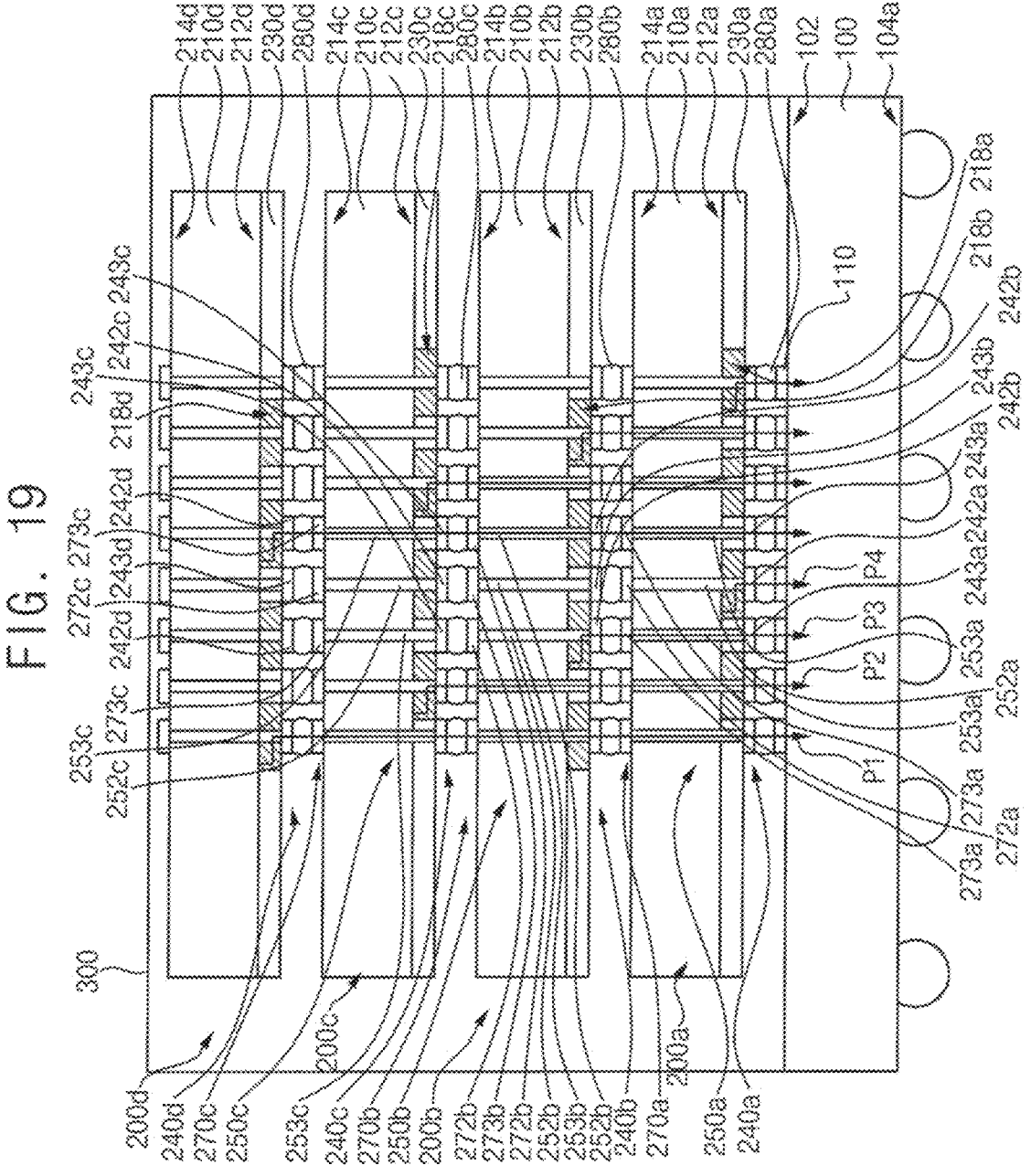

FIG. 19 is a cross-sectional view illustrating transmission paths of data input/output (I/O) signals in the semiconductor package of FIG. 18.

Referring to FIG. 19, a signal from an I/O circuitry 218*d* of the fourth semiconductor chip 200*d* may be transmitted to a base chip 100 through the second group of through electrodes 253*c* of the third semiconductor chip 200*c*, the first group of through electrodes 252*b* of the second semiconductor chip 200*b* and the second group of through electrodes 253*a* of the first semiconductor chip 200*a*. The second group of through electrodes 253*c* of the third semiconductor chip 200*c*, the first group of through electrodes 252*b* of the second semiconductor chip 200*b* and/or the second group of through electrodes 253*a* of the first semiconductor chip 200*a* may serve as an I/O signal path P1 which connects between the I/O circuitry 218*d* of the fourth semiconductor chip 200*d* and the base chip 100.

A signal from an I/O circuitry 218*c* of the third semiconductor chip 200*c* may be transmitted to the base chip 100 through the second group of through electrodes 253*b* of the second semiconductor chip 200*b* and the first group of through electrodes 252*a* of the first semiconductor chip 200a. The second group of through electrodes 253b of the second semiconductor chip 200b and/or the first group of through electrodes 252a of the first semiconductor chip 200a may serve as an I/O signal path P2 which connects between the I/O circuitry 218c of the third semiconductor chip 200c and the base chip 100.

A signal from an I/O circuitry 218b of the second semiconductor chip 200b may be transmitted to the base chip 100 through the second group of through electrodes 253a of the first semiconductor chip 200a. The second group of through electrodes 253a of the first semiconductor chip 200a may serve as an I/O signal path P3 which connects between the I/O circuitry 218b of the second semiconductor chip 200b and the base chip 100.

Only one of every four bonding pads consecutively arranged in a given row may be operably connected to the I/O circuitry, defining a staggered I/O circuit pattern. This may allow for point-to-point connections between the base chip 100 and the first to fourth semiconductor chips 200a, 200b, 200c and/or 200d.

Hereinafter, a method of manufacturing the semiconductor package in FIG. 18 will be explained.

FIGS. 20 to 25 are views illustrating a method of manufacturing a semiconductor package in accordance with some example embodiments.

Figure 20:
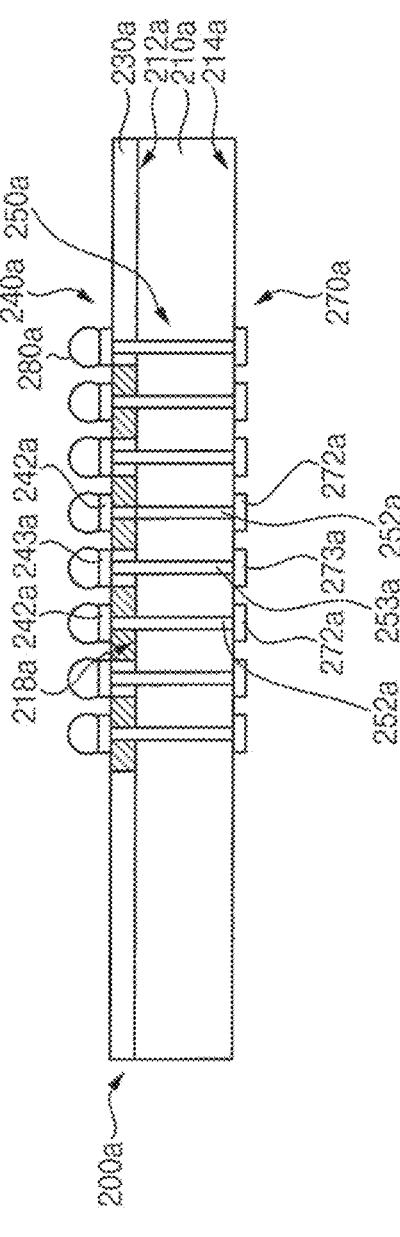

Referring to FIG. 20, a first semiconductor chip 200a with first conductive connection members 280a attached thereto may be prepared.

Processes the same as or similar to those described with reference to FIGS. 6 to 11 may be performed to form the first conductive connection members 280a on first bonding pads 240a of the first semiconductor chip 200a.

The first semiconductor chip 200a may have a first surface and a second surface opposite to each other, and may include a plurality of first bonding pads 240a provided on the first surface, a plurality of second bonding pads 270a provided on the second surface, and/or a plurality of first through electrodes 250a electrically connecting the first and second bonding pads 240a and 270a.

The first through electrodes 250a may include a first group of through electrodes 252a and/or a second group of through electrodes 253a alternately arranged in a first direction. The first group of through electrodes 252a may be arranged to be spaced apart from each other in the first direction. The second group of through electrodes 253a may be arranged to be spaced apart from each other in the first direction. Each, or one or more, of the second group of through electrodes 253a may be arranged between the first group of through electrodes 252a adjacent to each other.

The first bonding pads 240a may include a first group of bonding pads 242a electrically connected to the first group of through electrodes 252a respectively and/or a second group of bonding pads 243a electrically connected to the second group of through electrodes 253a respectively. The first group of bonding pads 242a and the second group of bonding pads 243a may be alternately arranged in the first direction.

The second bonding pads 270a may include a first group of bonding pads 272a electrically connected to the first group of through electrodes 252a respectively and/or a second group of bonding pads 273a electrically connected to the second group of through electrodes 253a respectively. The first group of bonding pads 272a and the second group of bonding pads 273a may be alternately arranged in the first direction.

Figure 21:
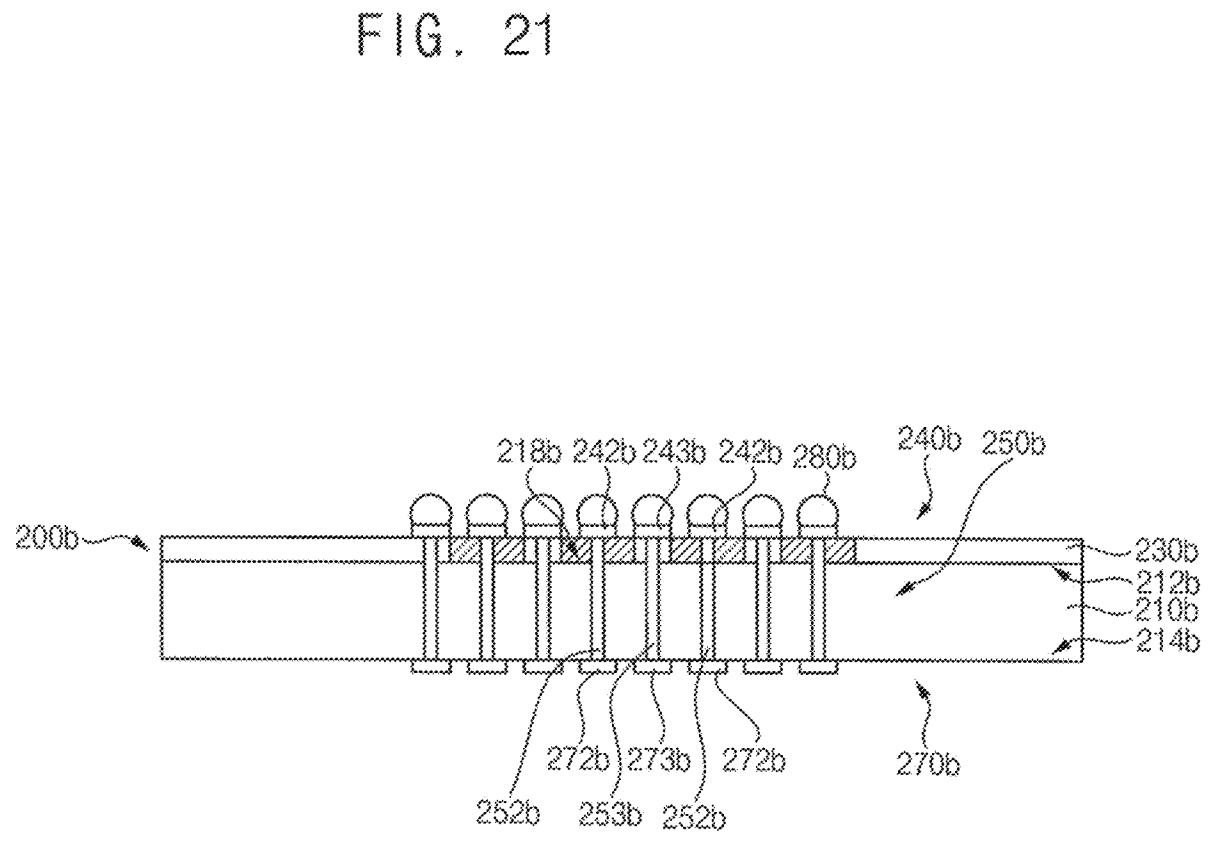

Referring to FIG. 21, a second semiconductor chip 200b with second conductive connection members 280b attached thereto may be prepared.

Processes the same as or similar to those described with reference to FIGS. 6 to 11 may be performed to form the second conductive connection members 280b on third bonding pads 240b of the second semiconductor chip 200b.

The second semiconductor chip 200b may be identical to the first semiconductor chip 200a in terms of structural form except for arrangements of through electrodes and bonding pads.

For example, when the first through electrodes 250a of the first semiconductor chip 200a and second through electrodes 250b of the second semiconductor chip 200b are disposed to overlap each other, a first group of through electrodes 252b of the second semiconductor chip 200b may be overlapped with the second group of through electrodes 253a of the first semiconductor chip 200a respectively and/or a second group of through electrodes 253b of the second semiconductor chip 200b may be overlapped with the first group of through electrodes 252a of the first semiconductor chip 200a respectively.

Additionally, when the first and second bonding pads 240a and 270a of the first semiconductor chip 200a and third and fourth bonding pads 240b and 270b of the second semiconductor chip 200b are disposed to overlap each other, a first group of bonding pads 242b and 272b of the second semiconductor chip 200b may be overlapped with the second group of bonding pads 243a and 273a of the first semiconductor chip 200a respectively and/or a second group of bonding pads 243b and 273b of the second semiconductor chip 200b may be overlapped with the first group of bonding pads 242a and 272a of the first semiconductor chip 200a respectively.

Figure 22:
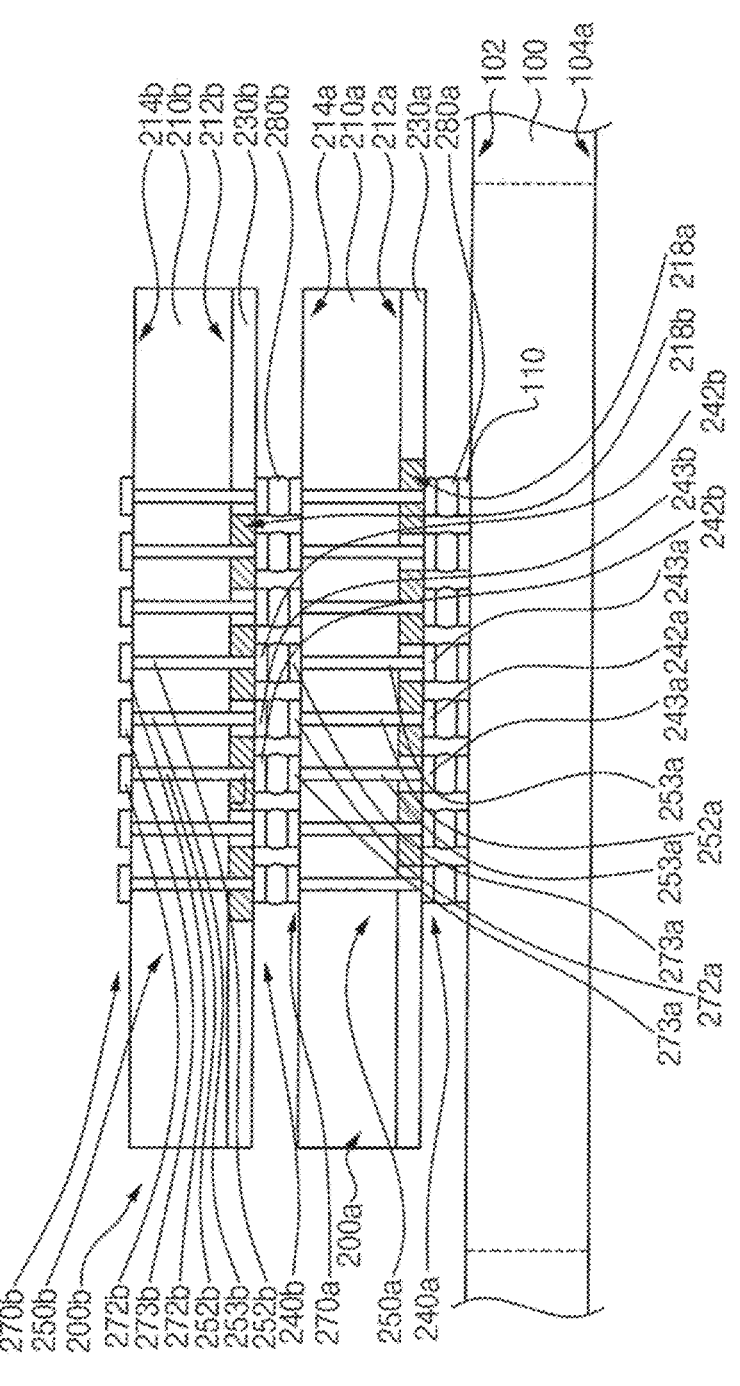

Referring to FIG. 22, the first semiconductor chip 200a and the second semiconductor chip 200b may be sequentially stacked on a base substrate 100.

In some example embodiments, the first semiconductor chip 200a may be stacked on the base substrate 100 using a substrate support system WSS. After attaching the base substrate 100 to a carrier substrate using an adhesive film, the first semiconductor chip 200a may be stacked on the base substrate 100.

The first semiconductor chip 200a may be stacked on the base substrate 100 through the first conductive connection members 280a. The first semiconductor chip 200a may be arranged on the base substrate 100 such that the first bonding pad 240a of the first semiconductor chip 200a faces a substrate pad 110 of the base substrate 100.

Then, the second semiconductor chip 200b may be stacked on the first semiconductor chip 200a through the second conductive connection members 280b. The second semiconductor chip 200b may be arranged on the first semiconductor chip 200a such that the third bonding pad 240b of the second semiconductor chip 200b faces the second bonding pad 270a of the first semiconductor chip 200a.

In some example embodiments, when the second through electrodes 250b of the second semiconductor chip 200b are disposed to be overlapped with the first through electrodes 250a of the first semiconductor chip 200a, the first group of through electrodes 252b of the second semiconductor chip 200b may be electrically connected to the second group of through electrodes 253a of the first semiconductor chip 200a respectively and the second group of through electrodes 253b of the second semiconductor chip 200b may be electrically connected to the first group of through electrodes 252*a* of the first semiconductor chip 200*a* respectively. For example, the second semiconductor chip 200*b* may be stacked to completely (or substantially) overlap with the first semiconductor chip 200*a* without being offset from the first semiconductor chip 200*a*.

The first group of bonding pads 242*b* of the third bonding pads 240*b* of the second semiconductor chip 200*b* may be electrically connected to the second group of bonding pads 273*a* of the second bonding pads 270*a* of the first semiconductor chip 200*a* respectively, and the second group of bonding pads 243*b* of the third bonding pads 240*b* of the second semiconductor chip 200*b* may be electrically connected to the first group of bonding pads 272*a* of the second bonding pads 270*a* of the first semiconductor chip 200*a* respectively.

Figure 23:
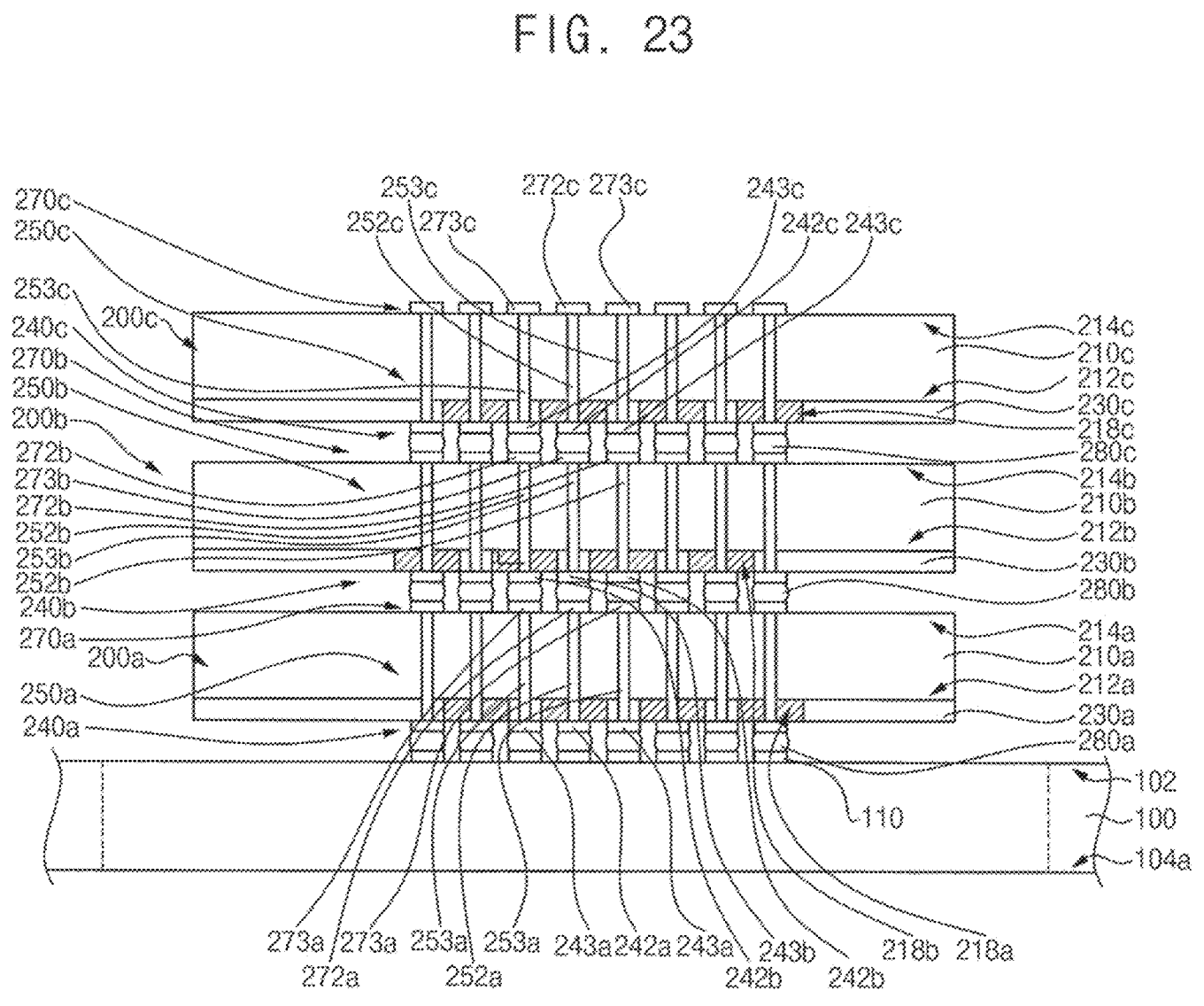

Referring to FIG. 23, a third semiconductor chip 200*c* may be stacked on the second semiconductor chip 200*b*.

Processes the same as or similar to those described with reference to FIG. 20 may be performed to form third conductive connection members 280*c* on fifth bonding pads 240*c* of the third semiconductor chip 200*c*.

In some example embodiments, the third semiconductor chip 200*c* may be identical to the first semiconductor chip 200*a* in terms of structural form. For example, an arrangement of through electrodes and an arrangement of bonding pads of the third semiconductor chip 200*c* may be the same as the arrangement of the through electrodes and the arrangement of the bonding pads of the first semiconductor chip 200*a*.

The third semiconductor chip 200*c* may be stacked on the second semiconductor chip 200*b* through the third conductive connection members 280*c*. The third semiconductor chip 200*c* may be arranged on the second semiconductor chip 200*b* such that fifth bonding pad 240*c* of the third semiconductor chip 200*c* faces the fourth bonding pad 270*b* of the second semiconductor chip 200*b*.

In some example embodiments, when third through electrodes 250*c* of the third semiconductor chip 200*c* are disposed to be overlapped with the second through electrodes 250*b* of the second semiconductor chip 200*b*, a first group of through electrodes 252*c* of the third semiconductor chip 200*c* may be electrically connected to the second group of through electrodes 253*b* of the second semiconductor chip 200*b* respectively and a second group of through electrodes 253*c* of the third semiconductor chip 200*c* may be electrically connected to the first group of through electrodes 252*b* of the second semiconductor chip 200*b* respectively. For example, the third semiconductor chip 200*c* may be stacked to completely (or substantially) overlap with the second semiconductor chip 200*b* without being offset from the second semiconductor chip 200*b*.

A first group of bonding pads 242*c* of the fifth bonding pads 240*c* of the third semiconductor chip 200*c* may be electrically connected to the second group of bonding pads 273*b* of the fourth second bonding pads 270*b* of the second semiconductor chip 200*b* respectively, and/or a second group of bonding pads 243*c* of the fifth bonding pads 240*c* of the third semiconductor chip 200*c* may be electrically connected to the first group of bonding pads 272*b* of the fourth bonding pads 270*b* of the second semiconductor chip 200*b* respectively.

Figure 24:
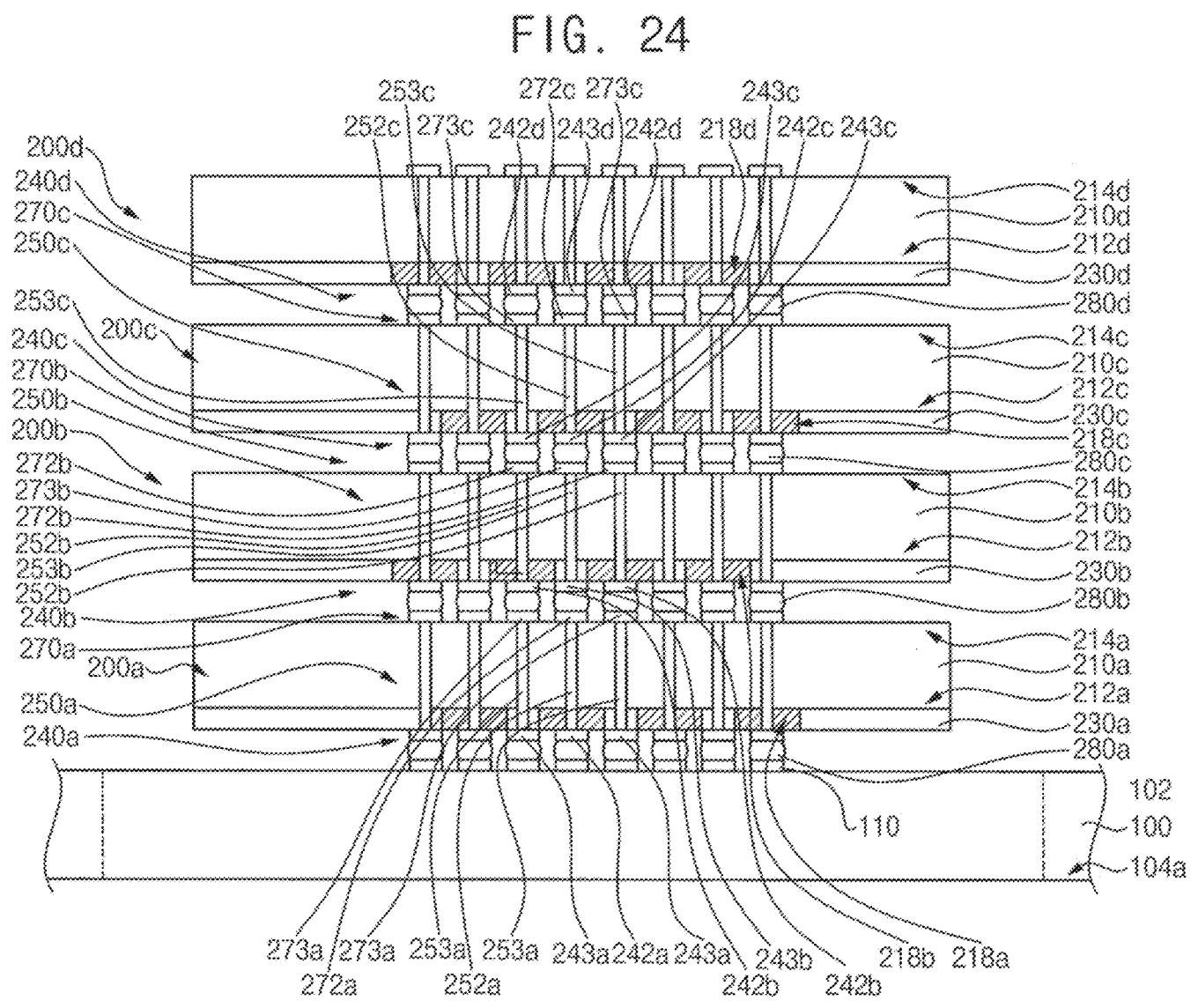

Referring to FIG. 24, a fourth semiconductor chip 200*d* may be stacked on the third semiconductor chip 200*c*.

Processes the same as or similar to those described with reference to FIG. 20 may be performed to form fourth conductive connection members 280*d* on seventh bonding pads 240*d* of the fourth semiconductor chip 200*d*.

In some example embodiments, the fourth semiconductor chip 200*d* may be identical to the second semiconductor chip 200*b* in terms of structural form. For example, an arrangement of through electrodes and an arrangement of bonding pads of the fourth semiconductor chip 200*d* may be the same as the arrangement of the through electrodes and the arrangement of the bonding pads of the second semiconductor chip 200*b*.

In some example embodiments, when fourth through electrodes 250*d* of the fourth semiconductor chip 200*d* are disposed to be overlapped with the third through electrodes 250*c* of the third semiconductor chip 200*c*, a first group of through electrodes 252*d* of the fourth semiconductor chip 200*d* may be electrically connected to the second group of through electrodes 253*c* of the third semiconductor chip 200*c* respectively and/or a second group of through electrodes 253*d* of the fourth semiconductor chip 200*d* may be electrically connected to the first group of through electrodes 252*c* of the third semiconductor chip 200*c* respectively. For example, the fourth semiconductor chip 200*d* may be stacked to completely (or substantially) overlap with the third semiconductor chip 200*c* without being offset from the third semiconductor chip 200*c*.

A first group of bonding pads 242*d* of the seventh bonding pads 240*d* of the fourth semiconductor chip 200*d* may be electrically connected to the second group of bonding pads 273*c* of the sixth second bonding pads 270*c* of the third semiconductor chip 200*c* respectively, and/or a second group of bonding pads 243*d* of the seventh bonding pads 240*d* of the fourth semiconductor chip 200*d* may be electrically connected to the first group of bonding pads 272*c* of the sixth bonding pads 270*c* of the third semiconductor chip 200*c* respectively.

Figure 25:
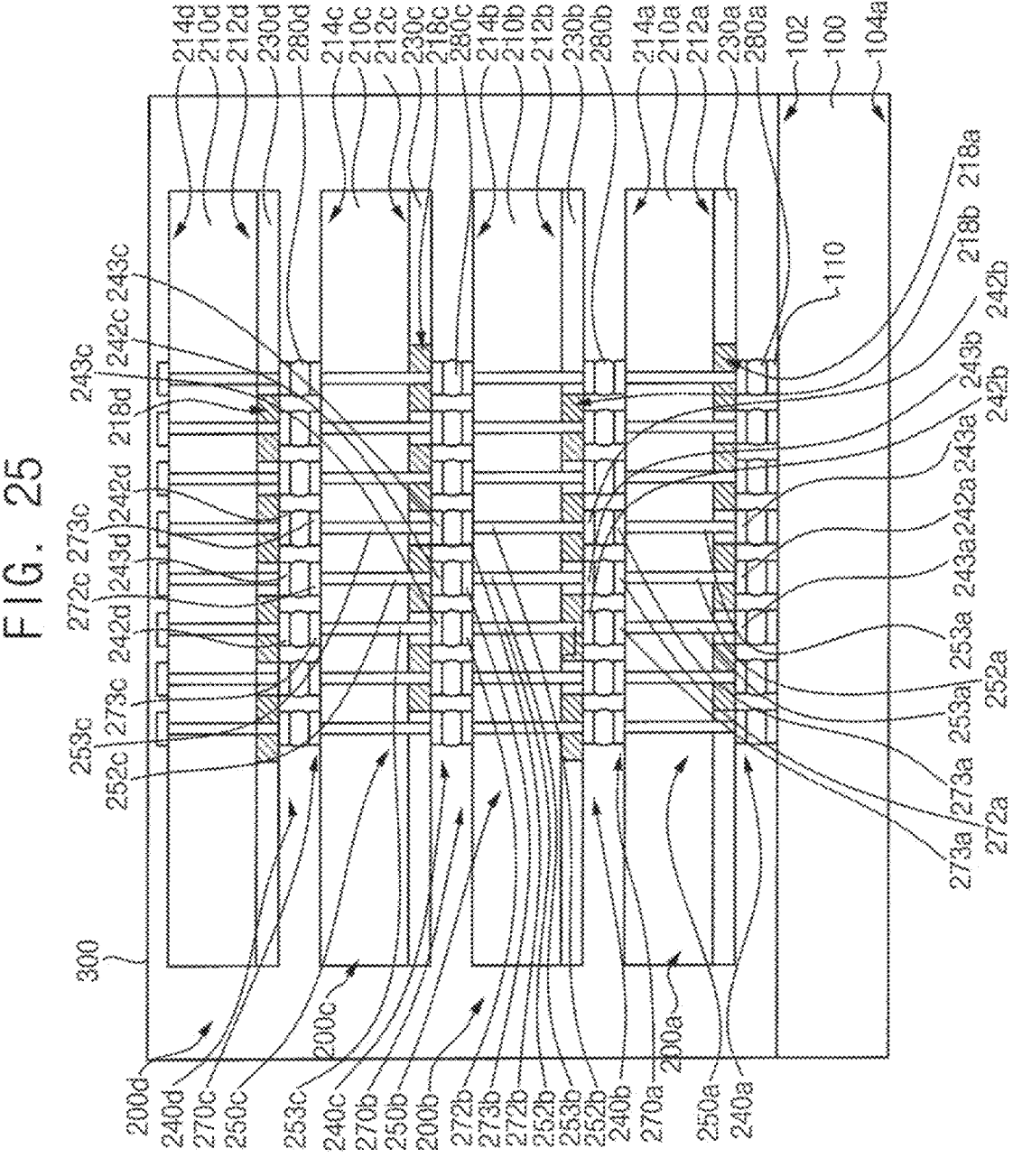

Referring to FIG. 25, a molding member 300 may be formed on the base substrate 100 to cover the first to fourth semiconductor chips 200*a*, 200*b*, 200*c* and/or 200*d*.

In some example embodiments, the molding member 400 may be formed to fill gaps between the base substrate 100 and the first to fourth semiconductor chips 200*a*, 200*b*, 200*c* and/or 200*d*. The molding member 400 may be formed using a polymer material such as epoxy molding compound (EMC).

Alternatively, gaps between the base substrate 100 and the first to fourth semiconductor chips 200*a*, 200*b*, 200*c* and/or 200*d* may be filled by underfill members and/or adhesive films.

Then, the base substrate 100 and the molding member 300 may be cut along a cutting region to complete the semiconductor package 11 in FIG. 18.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of some example embodiments and is not to be construed as limiting thereof. Although a few example embodiments have been described, those skilled in the art will readily appreciate that many modifications are possible in some example embodiments without materially departing from the novel teachings and advantages of the present invention. Accordingly, all such modifications are intended to be included within the scope of example embodiments as defined in the claims.

What is claimed is:

1. A semiconductor package, comprising:
first, second, third and fourth semiconductor chips sequentially stacked on one another,
wherein each of the first, second, third and fourth semiconductor chips includes
a first group of bonding pads and a second group of bonding pads alternately arranged in a first direction, a first group of through electrodes electrically connected to the first group of bonding pads and a second group of through electrodes electrically connected to the second group of bonding pads, and
input/output (I/O) circuitry selectively connected to the first group of bonding pads respectively, such that only one in every four bonding pads in the first direction is operably connected to the I/O circuitry,
wherein the I/O circuitry of the fourth semiconductor chip is configured to transmit a signal through the second group of through electrodes of the third semiconductor chip, the first group of through electrodes of the second semiconductor chip, and the second group of through electrodes of the first semiconductor chip, and
wherein the second group of through electrodes of the third semiconductor chip is vertically aligned with the first group of through electrodes of the second semiconductor chip.

2. The semiconductor package of claim 1, wherein
the first group of bonding pads of the first and third semiconductor chips are electrically connected to the second group of bonding pads of the second and fourth semiconductor chips respectively, and
the second group of bonding pads of the first and third semiconductor chips are electrically connected to the first group of bonding pads of the second and fourth semiconductor chips respectively.

3. The semiconductor package of claim 1, wherein the I/O circuitry of the third semiconductor chip is configured to transmit a signal through the second group of through electrodes of the second semiconductor chip and the first group of through electrodes of the first semiconductor chip.

4. The semiconductor package of claim 3, wherein the I/O circuitry of the second semiconductor chip is configured to transmit a signal through the second group of through electrodes of the first semiconductor chip.

5. The semiconductor package of claim 1, wherein the first, second and third semiconductor chips include a same arrangement of the respective first and second groups of through electrodes.

6. The semiconductor package of claim 5, wherein the second semiconductor chip is offset from the first semiconductor chip by an interval in the first direction, and the third semiconductor chip is offset from the second semiconductor chip by the interval in a reverse direction of the first direction.

7. The semiconductor package of claim 6, wherein the interval is a distance between the through electrodes adjacent to each other.

8. The semiconductor package of claim 1, wherein a first arrangement of the respective first and second groups of through electrodes of the first and third semiconductor chips is different from a second arrangement of the first and second groups of through electrodes of the second semiconductor chip.

9. The semiconductor package of claim 8, wherein each of the first, second, third and fourth semiconductor chips further includes a fuse portion configured to electrically decouple the I/O circuitry from the first group of through electrodes.

10. A semiconductor package, comprising:
first, second, third and fourth semiconductor chips sequentially stacked on one another,
wherein each of the first, second and third semiconductor chips includes
a first group of through electrodes and a second group of through electrodes alternately arranged in a first direction, and
input/output (I/O) circuitry selectively connected to the first group of through electrodes respectively, such that only one in every four through electrodes in the first direction is operably connected to the I/O circuitry,
wherein the first group of through electrodes of the first and third semiconductor chips are electrically connected to the second group of through electrodes of the second and fourth semiconductor chips respectively,
wherein the second group of through electrodes of the first and third semiconductor chips are electrically connected to the first group of through electrodes of the first and third semiconductor chips respectively,
wherein an I/O circuitry of the fourth semiconductor chip is configured to transmit a signal through the second group of through electrodes of the third semiconductor chip, the first group of through electrodes of the second semiconductor chip, and the second group of through electrodes of the first semiconductor chip, and
wherein the second group of through electrodes of the third semiconductor chip is vertically aligned with the first group of through electrodes of the second semiconductor chip.

11. The semiconductor package of claim 10, wherein the first, second and third semiconductor chips include a same arrangement of the respective first and second groups of through electrodes.

12. The semiconductor package of claim 11, wherein the second semiconductor chip is offset from the first semiconductor chip by an interval in the first direction, and the third semiconductor chip is offset from the second semiconductor chip by the interval in a reverse direction of the first direction.

13. The semiconductor package of claim 12, wherein the interval is a distance between the through electrodes adjacent to each other.

14. The semiconductor package of claim 10, wherein a first arrangement of the respective first and second groups of through electrodes of the first and third semiconductor chips is different from a second arrangement of the first and second groups of through electrodes of the second semiconductor chip.

15. The semiconductor package of claim 14, wherein the second semiconductor chip overlaps the first semiconductor chip without being offset from the first semiconductor chip, and the third semiconductor chip overlaps the second semiconductor chip without being offset from the second semiconductor chip.

16. The semiconductor package of claim 10, wherein each of the first, second, third and fourth semiconductor chips further includes a fuse portion configured to electrically decouple the I/O circuitry from the first group of through electrodes.

17. The semiconductor package of claim 10, wherein each of the first, second, third and fourth semiconductor chips includes a first group of bonding pads electrically connected to the first group of through electrodes respectively and a second group of bonding pads electrically connected to the second group of through electrodes respectively.

18. A semiconductor package, comprising:

first, second, third and fourth semiconductor chips sequentially stacked on one another and electrically connected to each other by conductive connection members, wherein each of the first, second, third and fourth semiconductor chips includes a first surface and a second surface opposite to each other, a first group of bonding pads and a second group of bonding pads on the respective first surface alternately arranged in a first direction, and input/output (I/O) circuitry selectively connected to the first group of bonding pads respectively, such that only one in every four bonding pads in the first direction is operably connected to the I/O circuitry, wherein each of the first, second and third semiconductor chips further includes a first group of through electrodes electrically connected to the first group of bonding pads, and a second group of through electrodes electrically connected to the second group of bonding pads stacked on a package substrate, wherein the first group of bonding pads of the first and third semiconductor chips are electrically connected to the second group of bonding pads of the second and fourth semiconductor chips respectively, wherein the second group of bonding pads of the first and third semiconductor chips are electrically connected to the first group of bonding pads of the second and fourth semiconductor chips respectively, wherein the I/O circuitry of the fourth semiconductor chip is configured to transmit a signal through the second group of through electrodes of the third semiconductor chip, the first group of through electrodes of the second semiconductor chip, and the second group of through electrodes of the first semiconductor chip, and wherein the second group of through electrodes of the third semiconductor chip is vertically aligned with the first group of through electrodes of the second semiconductor chip.

19. The semiconductor package of claim 1, wherein each through electrode of the first group of through electrodes extends from a top bonding pad of the first group of bonding pads to a respective bottom bonding pad of the first group of bonding pads.

20. The semiconductor package of claim 1, wherein the I/O circuitry of the fourth semiconductor chip is configured to transmit the signal straight downwards through the vertically aligned second group of through electrodes of the third semiconductor chip, the first group of through electrodes of the second semiconductor chip, and the second group of through electrodes of the first semiconductor chip.

\* \* \* \* \*